(12) United States Patent
Becnel

(10) Patent No.: US 12,494,597 B2
(45) Date of Patent: Dec. 9, 2025

(54) MULTIPLATFORM MODULAR AVIONICS SYSTEM

(71) Applicant: Modular Aerospace, LLC, Madison, AL (US)

(72) Inventor: Eric Dupont Becnel, Madison, AL (US)

(73) Assignee: Modular Aerospace, LLC, Madison, AL (US)

( * ) Notice: Subject to any disclaimer, the term of this patent is extended or adjusted under 35 U.S.C. 154(b) by 422 days.

(21) Appl. No.: 17/940,942

(22) Filed: Sep. 8, 2022

(65) Prior Publication Data

US 2024/0195094 A1 Jun. 13, 2024

Related U.S. Application Data

(60) Provisional application No. 63/242,171, filed on Sep. 9, 2021.

(51) Int. Cl.
| | |
|---|---|
| *H05K 7/14* | (2006.01) |
| *H01R 12/71* | (2011.01) |
| *H01R 12/72* | (2011.01) |

(52) U.S. Cl.
CPC ......... *H01R 12/716* (2013.01); *H01R 12/724* (2013.01); *H01R 12/727* (2013.01); *H05K 7/1427* (2013.01); *H01R 2201/26* (2013.01)

(58) Field of Classification Search
CPC .. H01R 12/716; H01R 12/724; H01R 12/727; H01R 2201/26; H05K 7/1427; H05K 7/14; H05K 7/1422
See application file for complete search history.

(56) References Cited

U.S. PATENT DOCUMENTS

| | | | | |
|---|---|---|---|---|
| 4,601,527 A | * | 7/1986 | Lemke | H01R 12/00 439/877 |
| 6,394,815 B1 | * | 5/2002 | Sarno | H05K 7/1449 361/788 |
| 2016/0093985 A1 | * | 3/2016 | Zhang | H01R 43/20 29/830 |

* cited by examiner

*Primary Examiner* — Vanessa Girardi
(74) *Attorney, Agent, or Firm* — Bradley Arant Boult Cummings LLP; Alex H. Huffstutter; Stephen H. Hall

(57) ABSTRACT

Avionics systems are provided having an integration plate and a structural network switch. The structural network switch has module connection features. Avionics modules connect to the structural network switch by the module connection features. This allows for robust, multiplatform, modular avionics systems.

11 Claims, 46 Drawing Sheets

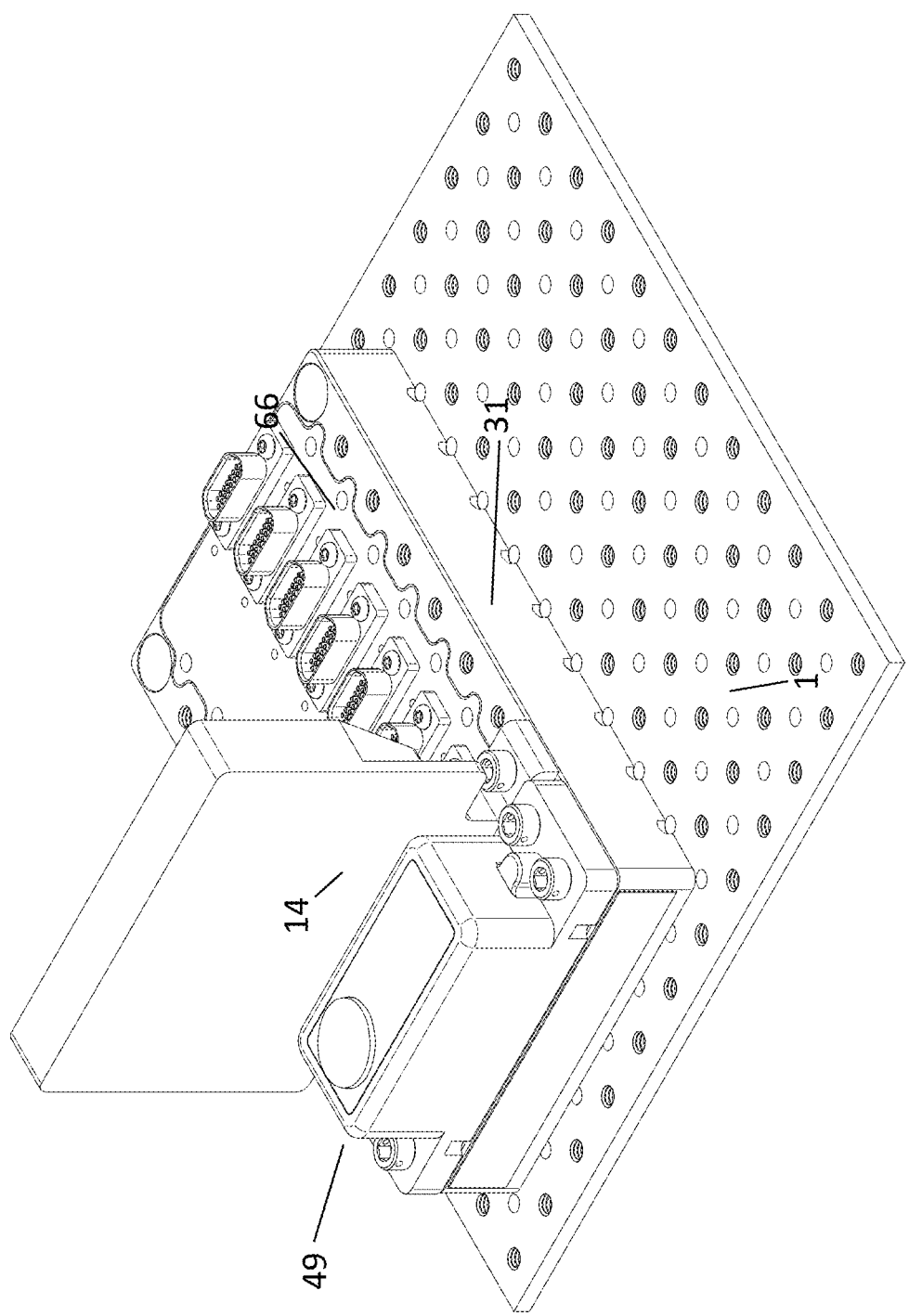

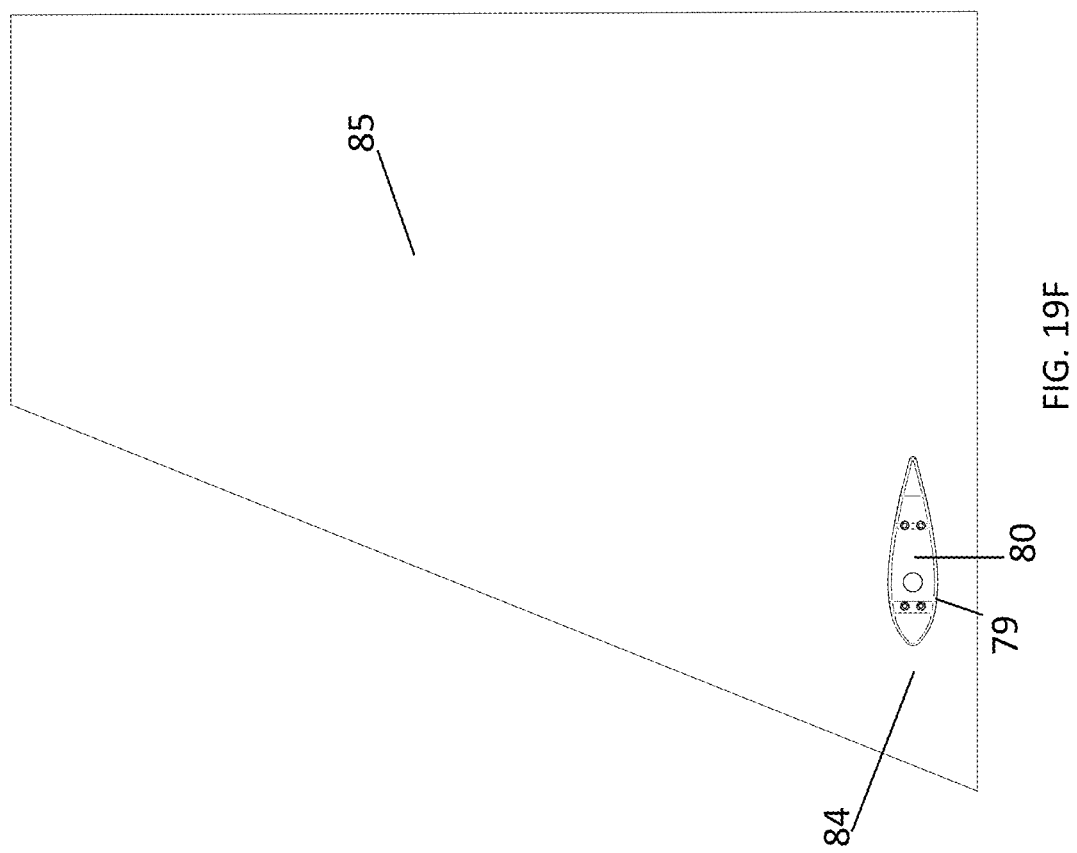

MULTIPLATFORM MODULAR AVIONICS SYSTEM

CROSS-REFERENCE TO RELATED APPLICATIONS

This application claims priority to U.S. Provisional Patent Application Ser. No. 63/242,171, titled "Multiplatform Modular Avionics System" and filed on Sep. 9, 2021; the specification, drawings, and claims thereof are entirely incorporated herein by reference.

FIELD OF INVENTION

This disclosure relates generally to a system for installing, mounting, and connecting avionics. This disclosure also relates generally to components of such a system and to methods of use of the system and of the components. This disclosure also relates generally to avionics systems that are modular, durable, multi-platform, compact, and/or standardizable.

BACKGROUND

Avionics systems are intelligent electronics which are used to monitor and control vehicles or systems. They may be used to observe properties of the system, the environment they are within, and/or an environment they are able to remotely observe. They can control or signal the control of components of the vehicle or system to achieve an objective. This could be for the navigation of the vehicle, sensor operations to get a better understanding of a remote location being observed or to align the direction of antennas to provide precise communication capabilities.

Traditionally, aerospace systems are considered high reliability, demanding their avionic systems to operate in harsh environments considering thermal, vibration, moisture, and electrical considerations among others. Additionally, they are considered long term assets and have considerations for installation and maintenance by mechanics or specialists years after a vehicle enters service.

New considerations to avionics systems include cyber security, costs, and mission flexibility. As vehicles are operating both as fly-by-wire and remote-pilot or pilotless, commonly without physical security being guaranteed, the reliability of the system must be enhanced to ensure any abnormality typically observed by an aircrew can be identified by the system itself. The missions being performed are requiring a higher quantity of vehicles in a competitive industry demanding a production friendly, cost-effective solution. The mission these systems are used for has been proven to evolve. This evolution gets faster as new technologies are introduced to industry more rapidly and the designers of a vehicle or system must consider its modernization approach. The ability to exchange or update various parts of the system is often considered in order to provide the best long term affordable system.

Though Avionics is particular to aerospace systems such as aircraft, rocket, space, and lunar systems, both manned and unmanned, the technology can be applied to any remote or independent system such as remote sensors, ground robots, autonomous vehicles, marine or sub-marine vehicles, among others.

The Multiplatform Modular Avionics System is a networked based modular avionics system. This system features an interface specification providing key mechanical, thermal, and electrical connections enabling flexible system design. Specific novel attributes of the interface, structure, modules, network switch, and structural relief devices enable a highly compact rugged system which is modular, serviceable, and scalable.

SUMMARY OF THE INVENTION

The invention specifies key mechanical attributes of the multiplatform modular avionics system which offer a novel technical solution to avionics presenting an optimized architecture allowing for modular assembly that is capable of serving many missions in many operational domains. The system can be used in the harshest of environments but allow for ease of maintenance and high flexibility for mission changes.

The invention specifies a novel interface which allows for functional avionic module integration by either a wire harness or a direct connection. By use of the novel structural network device, this optimization optionally provides the benefit of tight integration of avionics capabilities such as no wire harness while allowing for accessibility for rapid integration and maintenance. The interface is suitable for the core avionics system integration and for remote individual module integration.

The invention captures a mechanical, thermal, and electrical architecture which may be used for standalone elements to be connected by wire harness or be connected by a tightly integrated module to network device connection, or any combination thereof. Specific details are additionally specified for precision alignment, thermal connection, and environmental protection of the interface. Considerations for structural relief are made for applications where inherent strength is inadequate.

An avionics system is disclosed, which, in a first embodiment, comprises: an integration plate having a mating surface and a regular array of connection holes; and at least one module, wherein each at least one module is connectible to the mating surface by a module connection feature; wherein each module connection feature comprises an electrical connector.

An avionics system is disclosed, which, in a second embodiment, comprises: an integration plate; and a structural network switch, wherein the structural network switch is mountable on the integration plate by a switch mount feature and wherein the structural network switch comprises a plurality of module connection features; wherein each module connection feature comprises an electrical connector; and wherein the structural network switch distributes power and data among the plurality of module connection features.

An avionics system is disclosed, which, in a third embodiment, comprises: an integration plate having a mating surface; a structural network switch, wherein the structural network switch has a foundation face opposite a connection face, wherein the structural network switch is mountable on the integration plate by a switch mount feature such that the foundation face of the structural network switch is proximate the mating surface of the integration plate; and a plurality of avionics modules, wherein each of the plurality of avionics modules is shaped approximately as a rectangular prism having a top face, a bottom face, a front face, a back face, a left face, a right face, a height, a width, and a depth, wherein each of the plurality of avionics modules is connectible to the connection face of the structural network switch by a module connection feature, and wherein a portion of the module connection feature is positioned on the bottom face of each the plurality of avionics modules;

wherein each module connection feature comprises an electrical connector; and wherein the structural network switch distributes power and data among the plurality of avionics modules.

BRIEF DESCRIPTION OF THE DRAWINGS

The following drawings are attached to—and form a portion of—this disclosure:

FIG. 15 is a top perspective view of an avionics system having a structural network switch connected to an integration plate, a module connected to the structural network switch, and an image sensing module connected to the structural network switch.

FIG. 19F is a top view of an avionics system having an image sensing module in an encasement as mounted on a wing.

DEFINITIONS

Figure 1:
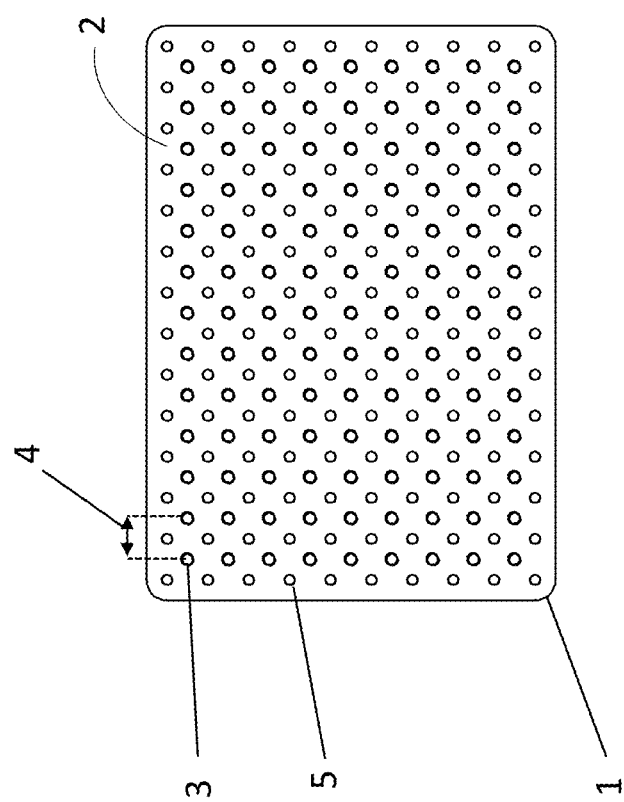
FIG. 1 is a top view of an integration plate.

Unless otherwise defined, all terms (including technical and scientific terms) in this disclosure have the same meaning as commonly understood by one of ordinary skill in the art of this disclosure. It will be further understood that terms, such as those defined in commonly used dictionaries, should be interpreted as having a meaning that is consistent with their meaning in the context of the specification and should not be interpreted in an idealized or overly formal sense unless expressly defined otherwise in this disclosure. For brevity or clarity, well known functions or constructions may not be described in detail.

The terms "about" and "approximately" shall generally mean an acceptable degree of error or variation for the quantity measured in light of the nature or precision of the measurements. Typical, exemplary degrees of error or variation are within 20 percent (%), preferably within 10%, more preferably within 5%, of a given value or range of values. Numerical quantities given in this description are approximate unless stated otherwise, meaning that the term "about" or "approximately" can be inferred when not expressly stated.

The terminology used throughout the disclosure is for the purpose of describing particular embodiments only and is not intended to be limiting. The singular forms "a," "an," and "the" are intended to include the plural forms as well, unless the context clearly indicates otherwise.

The terms "first," "second," and the like are used to describe various features or elements, but these features or elements should not be limited by these terms. These terms are only used to distinguish one feature or element from another feature or element. Thus, a first feature or element discussed below could be termed a second feature or element, and similarly, a second feature or element discussed below could be termed a first feature or element without departing from the teachings of the disclosure. Likewise, terms like "top" and "bottom"; "front" and "back"; and "left" and "right" are used to distinguish certain features or elements from each other, but it is expressly contemplated that a top could be a bottom, and vice versa.

The term "consisting essentially of" means that, in addition to the recited elements, what is claimed may also contain other elements (steps, structures, ingredients, components, etc.) that do not adversely affect the operability of what is claimed for its intended purpose as stated in this disclosure. This term excludes such other elements that adversely affect the operability of what is claimed for its intended purpose as stated in this disclosure, even if such other elements might enhance the operability of what is claimed for some other purpose.

The terms "connected to," "in connection with," "in communication with," or "connecting" include any suitable connection or communication, including mechanical connection, electrical connection (e.g.: one or more wires), power connection, or signal-conducting channel (e.g., Ethernet, Local Interconnect Network (LIN) Bus, Controller Area Network (CAN), BLUETOOTH, near-field communication (NFC), or other inductive coupling or radio frequency (RF) link).

The term "processor" may include one or more processors having processing capability necessary to perform the processing functions described herein, including but not limited to hardware logic, computer readable instructions running on a processor, or any suitable combination thereof. A processor may run software to perform the operations described herein, including software accessed in machine readable form on a tangible non-transitory computer readable storage medium, as well as software that describes the configuration of hardware such as hardware description language (HDL) software used for designing chips.

The term "computer" may include a uniprocessor or multiprocessor machine, in the form of a desktop, laptop, remote server, tablet computer, smartphone, or other computing device. Accordingly, a computer may include one or more processors. Examples of processors include sequential state machines, microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), gated logic, and other suitable hardware configured to perform the various functionality described throughout this disclosure.

Additionally, a computer may include one or more memories. A memory may include a memory storage device or an addressable storage medium which may include, by way of example, random access memory (RAM), static random access memory (SRAM), dynamic random access memory (DRAM), electronically erasable programmable read-only memory (EEPROM), programmable read-only memory (PROM), erasable programmable read-only memory (EPROM), hard disks, floppy disks, laser disk players, digital video disks, compact disks, video tapes, audio tapes, magnetic recording tracks, magnetic tunnel junction (MTJ) memory, optical memory storage, quantum mechanical storage, electronic networks, and/or other devices or technologies used to store electronic content such as programs and data.

In particular, such one or more memories may store computer executable instructions that, when executed by the one or more processors, cause the one or more processors to implement the procedures and techniques described herein. The one or more processors may be operably associated with the one or more memories so that the computer executable instructions can be provided to the one or more processors for execution. For example, the one or more processors may be operably associated to the one or more memories through one or more buses. Furthermore, the computer may possess or may be operably associated with input devices (e.g., a keyboard, a keypad, controller, a mouse, a microphone, a touch screen, a sensor) and output devices such as (e.g., a computer screen, printer, or a speaker).

A computer may execute an appropriate operating system such as LINUX, UNIX, MICROSOFT WINDOWS, ANDROID, and RTOS, and/or the like. A computer may advantageously be equipped with a network communication device such as a network interface card, a modem, or other network connection device suitable for connecting to one or more networks.

A computer may advantageously contain control logic, or program logic, or other substrate configuration representing data and instructions, which cause the computer to operate in a specific and predefined manner as, described herein. In particular, the computer programs, when executed, enable a control processor to perform and/or cause the performance of features of the present disclosure. The control logic may advantageously be implemented as one or more modules. The modules may advantageously be configured to reside on the computer memory and execute on the one or more processors. The modules include, but are not limited to, software or hardware components that perform certain tasks. Thus, a module may include, by way of example, components, such as, software components, processes, functions, subroutines, procedures, attributes, class components, task components, object-oriented software components, segments of program code, drivers, firmware, micro-code, circuitry, data, and the like.

A control logic conventionally includes the manipulation of digital bits by the processor and the maintenance of these bits within memory storage devices resident in one or more of the memory storage devices. Such memory storage devices may impose a physical organization upon the collection of stored data bits, which are generally stored by specific electrical or magnetic storage cells.

A control logic generally performs a sequence of computer-executed steps. These steps generally require manipulations of physical quantities. Usually, although not necessarily, these quantities take the form of electrical, magnetic, or optical signals capable of being stored, transferred, combined, compared, or otherwise manipulated. It is conventional for those skilled in the art to refer to these signals as bits, values, elements, symbols, characters, text, terms, numbers, files, or the like. It should be kept in mind, however, that these and some other terms should be associated with appropriate physical quantities for computer operations, and that these terms are merely conventional labels applied to physical quantities that exist within and during operation of the computer based on designed relationships between these physical quantities and the symbolic values they represent.

It should be understood that manipulations within a computer are often referred to in terms of adding, comparing, moving, searching, or the like, which are often associated with manual operations performed by a human operator. It is to be understood that no involvement of the human operator may be necessary, or even desirable. The operations described herein are machine operations performed in conjunction with the human operator or user that interacts with the computer or computers.

It should also be understood that the programs, modules, processes, methods, and the like, described herein are but an exemplary implementation and are not related, or limited, to any particular computer, apparatus, or computer language. Rather, various types of general-purpose computing machines or devices may be used with programs constructed in accordance with some of the teachings described herein. In some embodiments, very specific computing machines, with specific functionality, may be required. Similarly, it may prove advantageous to construct a specialized apparatus to perform the method steps described herein by way of dedicated computer systems with hard-wired logic or programs stored in nonvolatile memory, such as, by way of example, read-only memory (ROM).

In some embodiments, features of computers can be implemented primarily in hardware using, for example, hardware components such as application specific integrated circuits (ASICs) or field-programmable gated arrays (FPGAs). Implementation of the hardware circuitry will be apparent to persons skilled in the relevant art(s). In yet another embodiment, features of computers can be implemented using a combination of both general-purpose hardware and software.

The term "signal" means any suitable signal, for example a voltage, a current, a duty cycle, a frequency of electrical oscillation, or a mechanical signal (e.g., pressure, vibration, a tap, or other mechanical signal) in some embodiments. For the avoidance of doubt, the term "signal" includes any digital spectrum or logic signal sent as a change (or transition) of voltage.

It is to be understood that any given elements of the disclosed embodiments of the invention may be embodied in a single structure, a single step, a single substance, or the like. Similarly, a given element of the disclosed embodiment may be embodied in multiple structures, steps, substances, or the like.

The following description illustrates and describes the processes, machines, manufactures, compositions of matter, and other teachings of the present disclosure. The disclosure shows and describes only certain embodiments of the processes, machines, manufactures, compositions of matter, and other teachings disclosed; but as mentioned above, it is to be understood that the teachings of the present disclosure are capable of use in various other combinations, modifications, and environments and are capable of changes or modifications within the scope of the teachings of this disclosure, commensurate with the skill and knowledge of a person having ordinary skill in the relevant art. The embodiments described are further intended to explain certain best modes known of practicing the processes, machines, manufactures, compositions of matter, and other teachings of the disclosure and to enable others skilled in the art to utilize the teachings of the disclosure in such, or other, embodiments and with the various modifications required by the particular applications or uses. Accordingly, the processes, machines, manufactures, compositions of matter, and other teachings of the present disclosure are not intended to limit the exact embodiments and examples disclosed herein. Any section headings herein are provided only for consistency with the suggestions of 37 C.F.R. § 1.77 or otherwise to provide organizational cues. These headings shall not limit or characterize the invention(s) set forth herein.

DETAILED DESCRIPTION

In addition to the description herein and in the accompanying drawings, additional detail is contained in U.S. Provisional Patent Application Ser. No. 63/242,171—titled "Multiplatform Modular Avionics System" and filed on Sep. 9, 2021—which is hereby incorporated by reference into the specification in its entirety.

FIG. 1 is a top view of an integration plate 1. The integration plate 1 is made of any suitable hard material—e.g., metal, composite, or plastic. The integration plate 1 has any suitable shape. In some embodiments, as shown in FIG. 1, the integration plate 1 is a substantially rectangular and substantially flat plate. In other embodiments, the integration plate 1 has other shapes. For example, an integration plate 1 might be substantially circular; such a shape would allow for installation into the bulkhead of a rocket. The integration plate 1 has a mating surface 2.

The integration plate 1 has an array (for example a regular array) of connection holes 3. In some embodiments, the connection holes 3 are through holes. In some embodiments, the connection holes 3 are threaded holes in the mating surface 2 of the integration plate 1. The pitch 4 of the connection holes 3 may be any suitable distance. In some embodiments, the pitch 4 of the connection holes 3 is approximately 0.5 inches. In other embodiments, the pitch 4 of the connection holes 3 may be approximately 1.0 inches. In other embodiments, the pitch 4 of the connection holes 3 may be approximately 0.3 inches In some embodiments, as shown in FIG. 1, the integration plate 1 has an array (for example a regular array) of alignment holes 5. In some embodiments, the alignment holes 5 are through holes. In some embodiments, the alignment holes 3 are divots, dimples, or depressions in the mating surface 2 of the integration plate 1. The pitch of the alignment holes 5 may be any suitable distance. In some embodiments, the pitch of the alignment holes 5 is equal to the pitch 4 of the connection holes.

Figure 2:
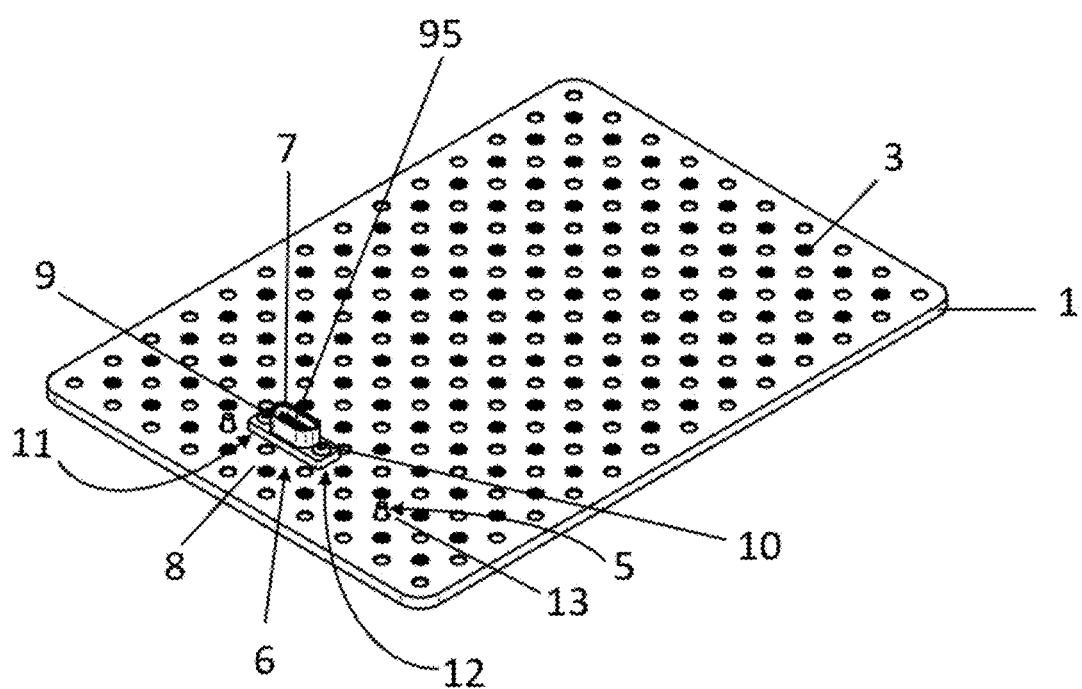
FIG. 2 is a top perspective view of a module connection feature on an integration plate.

FIG. 2 is a top perspective view of a module connection feature 6 on an integration plate 1. The module connection feature 6 comprises an electrical connector 7. The electrical connector may be any suitable electrical connector. In some embodiments, as shown in FIG. 2, the electrical connector 7 is a microminiature D ('micro-D') electrical connector compliant to Department of Defense specification for polarized shell, microminiature, rectangular connectors, MIL-DTL-83513 (such as the CANNON MIL-DTL-83513 Series Micro-D connector available at <https://ittcannon.com/mil-dtl-83513-series-micro-d-connectors>[accessed Aug. 31, 2022; archived at <https://web.archive.org/web/20220831200955/https://ittcannon.com/mil-dtl-83513-series-micro-d-connectors>]).

In some embodiments, as shown in FIG. 2, the electrical connector 7 comprises a fastening mechanism 8. The fastening mechanism 8 may be any suitable fastening mechanism. In the embodiment shown in FIG. 2, the fastening mechanism 8 comprises a first fastener 9 and a second fastener 10. The first fastener 9 passes (or screws) into (or through) a first connection hole 11; the second fastener 10 passes (or screws) into (or through) a second connection hole 12. The first fastener 9 and the second fastener 10 may be any suitable fastener. In some embodiments, the first fastener 9 and the second fastener 10 are screws—e.g., pan-head screws, socket-head screws, or jackscrews.

In some embodiments, as shown in FIG. 2, the module connection feature 6 comprises at least one alignment pin 13 (e.g., the two alignment pins shown in FIG. 2). The at least one alignment pin 13 passes through or into an alignment hole 5.

In some embodiments, a combination of features—including, for example, the fastening mechanism 8, alignment pins 11, threaded features on the fastening mechanism 8 (such as threaded screws), or lockwire—creates a 'locking' effect that supports the effectiveness of the fastening mechanism 8.

In some embodiments, the module connection feature 6 comprises an environmental seal 95. The environmental seal 95 provides ingress protection to the module connection feature 6. The environment seal 95 is dust-tight and provides an ingress protection of the module connection feature 6 equivalent to an Ingress Protection code of at least IP60. (Ingress Protection codes are defined in International Electrotechnical standard 60529, for example IEC 60529:1989+AMD1:1999+AMD2:2013 CSV, including corrigenda at least through January 2019.) In some embodiments, the environmental seal 95 also protects against ingress of water and provides an ingress protection of the module connection feature 6 equivalent to an Ingress Protection code of at least IP63, of at least IP66, of at least IP67, or of at least IP68.

In some embodiments, the environmental seal 95 creates thermal contact between the module connection feature 6 and the integration plate 1. In some embodiments, the environmental seal 95 includes thermal grease and has a thermal conductivity greater than approximately 2 watts per meter-kelvin ("W/(m·K)"). In some embodiments, the environmental seal 95 has a thermal conductivity greater than approximately 5 W/(m·K). In some embodiments, the environmental seal 95 has a thermal conductivity greater than approximately 10 W/(m·K).

Figure 3A:
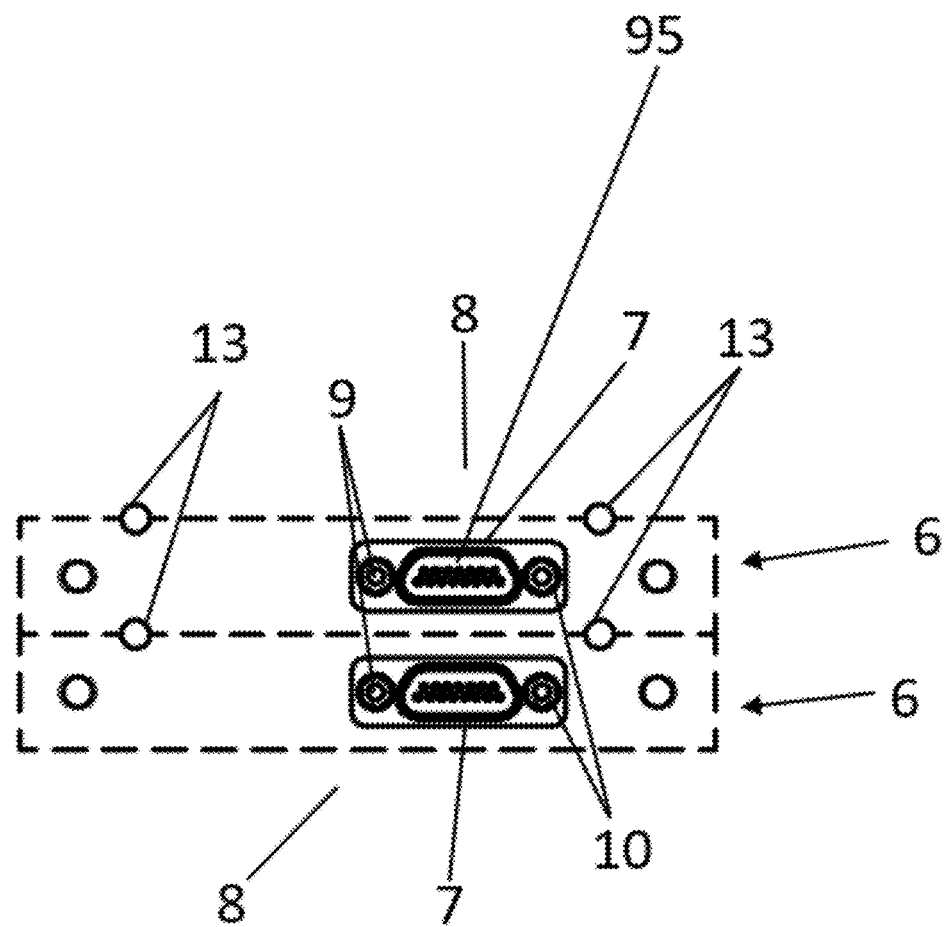
FIG. 3A is a bottom view of a pair of module connection features.

FIG. 3A is a bottom view of a pair of module connection features 6. The dashed box represents a logical grouping of each of the pair of module connection features 6. But the dashed box does not necessarily correspond to any physical structure. In some embodiments, the dashed box might coincide with a perimeter of a bottom face of a module (described below with respect to FIGS. 4A-F).

Figure 3B:
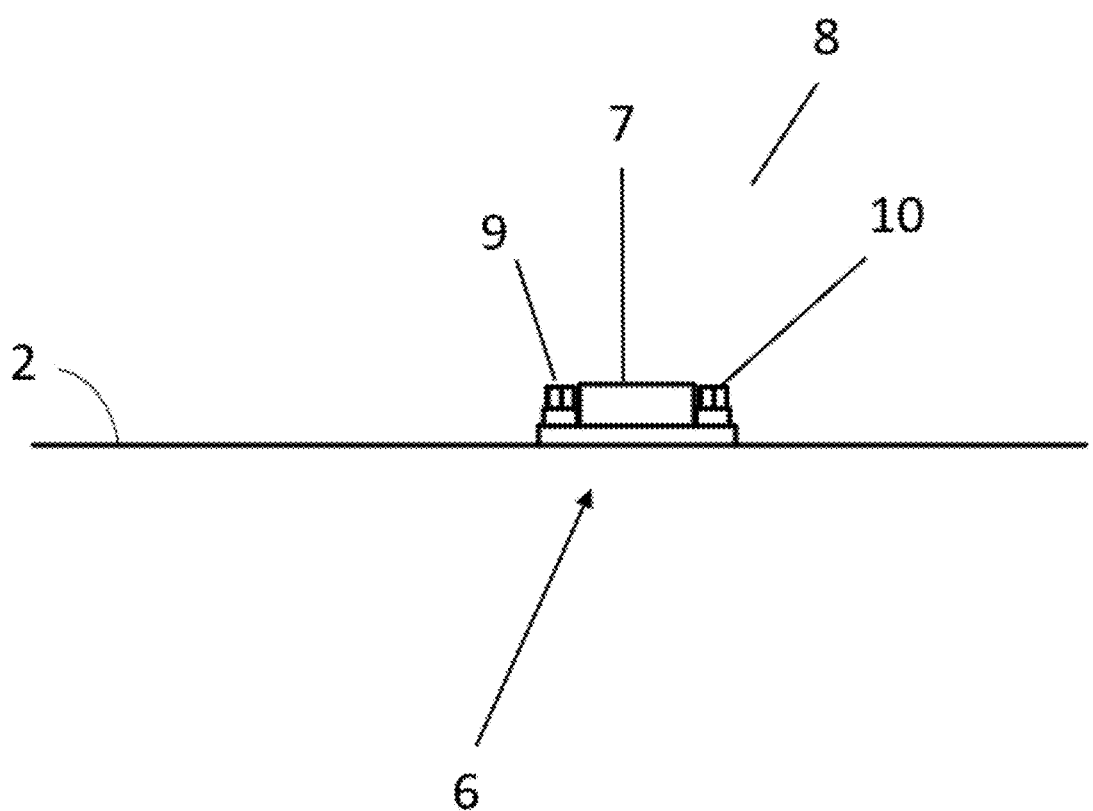
FIG. 3B is a front view of a module connection feature without the at least one alignment pin shown in FIG. 2 and FIG. 3A.

FIG. 3B is a front view of a module connection feature 6.

Figure 4A:
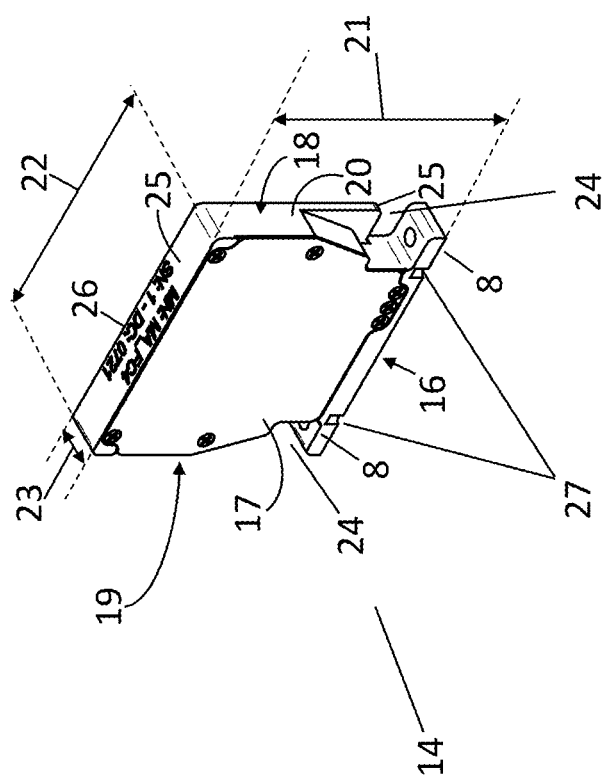
FIG. 4A is a front perspective view of a module.

FIG. 4A is a front perspective view of a module 14. The module 14 is an electronics module (e.g., an avionics module or an astrionics module). The module 14 is a hard case containing electronics systems—for example, electronic systems for communications, navigation, monitoring, flight control, fuel, collision avoidance, recording, weather, management, radar, sonar, electro-optics, electronic-support measures, defensive aid, networking, attitude determination and control, command, telemetry, or sensing.

The module 14 may have any suitable shape. In some embodiments, as shown in FIG. 4A, the module 14 is shaped approximately as a rectangular prism and has a top face 15, a bottom face 16, a front face 17, a back face 18, a left face 19, and a right face 20.

The module 14 may have any suitable dimensions. The module 14 has a height 21, a width 22, and a depth 23. In the embodiment shown in FIG. 4A, the height 21 and width 22 are each between approximately five times the depth 23 and approximately six times the depth 23. For example the height 21 and the width 22 may each be approximately 2.7 inches and the depth 23 be approximately 0.48 inches. In other embodiments, the height 21 and width 22 are each between approximately four times the depth 23 and approximately six times the depth 23. In other embodiments, the height 21 and width 22 are each between approximately three times the depth 23 and approximately six times the depth 23.

In some embodiments, as shown in FIG. 4A, the module 14 has cutouts 24. The cutouts 24 allow easier access to the fastening mechanism 8. The module shown in FIG. 4A also has fins 25. The top face 15 may bear a label 26. The module shown in FIG. 4A has alignment recesses to accommodate alignment pins 13 (not specifically shown in FIG. 4A).

Figure 4B:
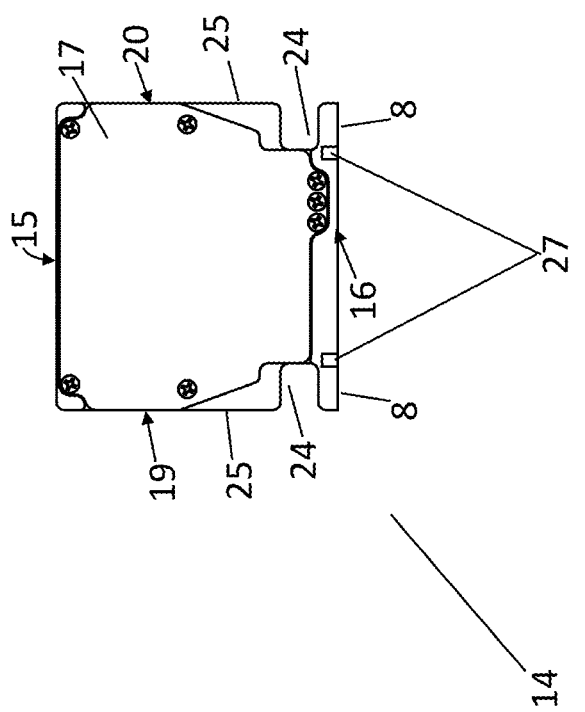
FIG. 4B is a front view of a module.

FIG. 4B is a front view of a module 14.

Figure 4C:
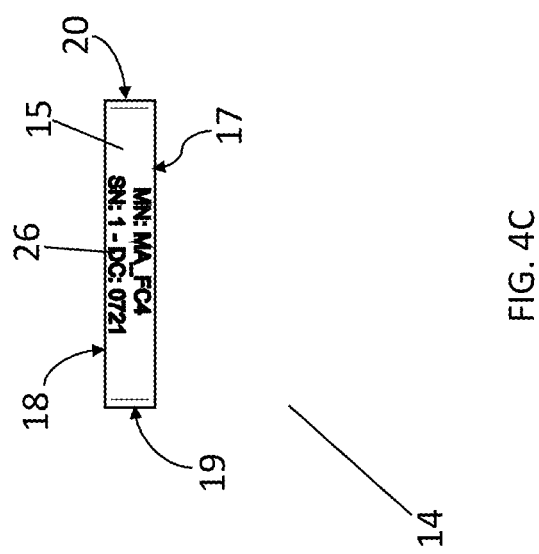
FIG. 4C is a top view of a module.

FIG. 4C is a top view of a module 14.

Figure 4D:
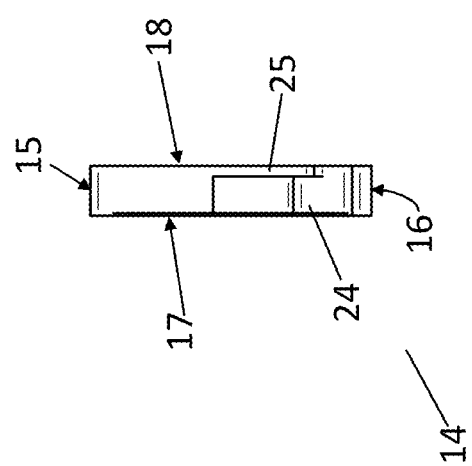
FIG. 4D is a right-side view of a module.

FIG. 4D is a right-side view of a module 14.

Figure 4E:
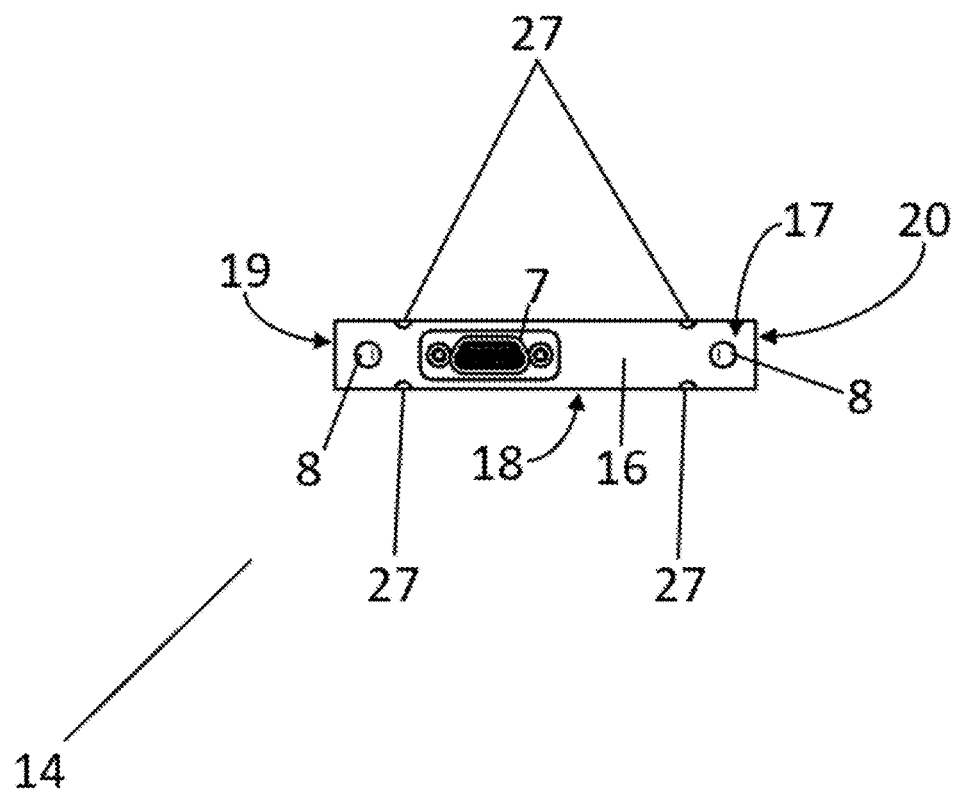
FIG. 4E is a bottom view of a module.

FIG. 4E is a bottom view of a module 14. The module 14 shown in FIG. 4E has on its bottom face 16 a module connection feature 6 having an electrical connector 7.

Figure 4F:
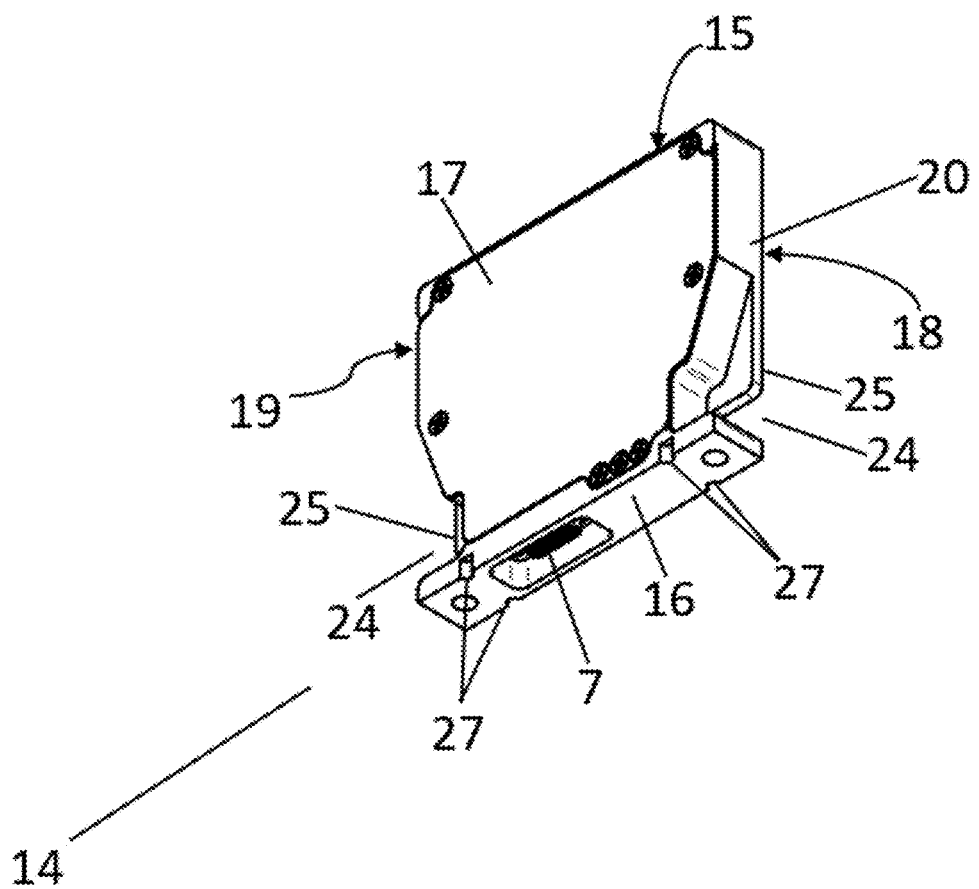
FIG. 4F is a bottom perspective view of a module.

FIG. 4F is a bottom perspective view of a module.

Figure 5:
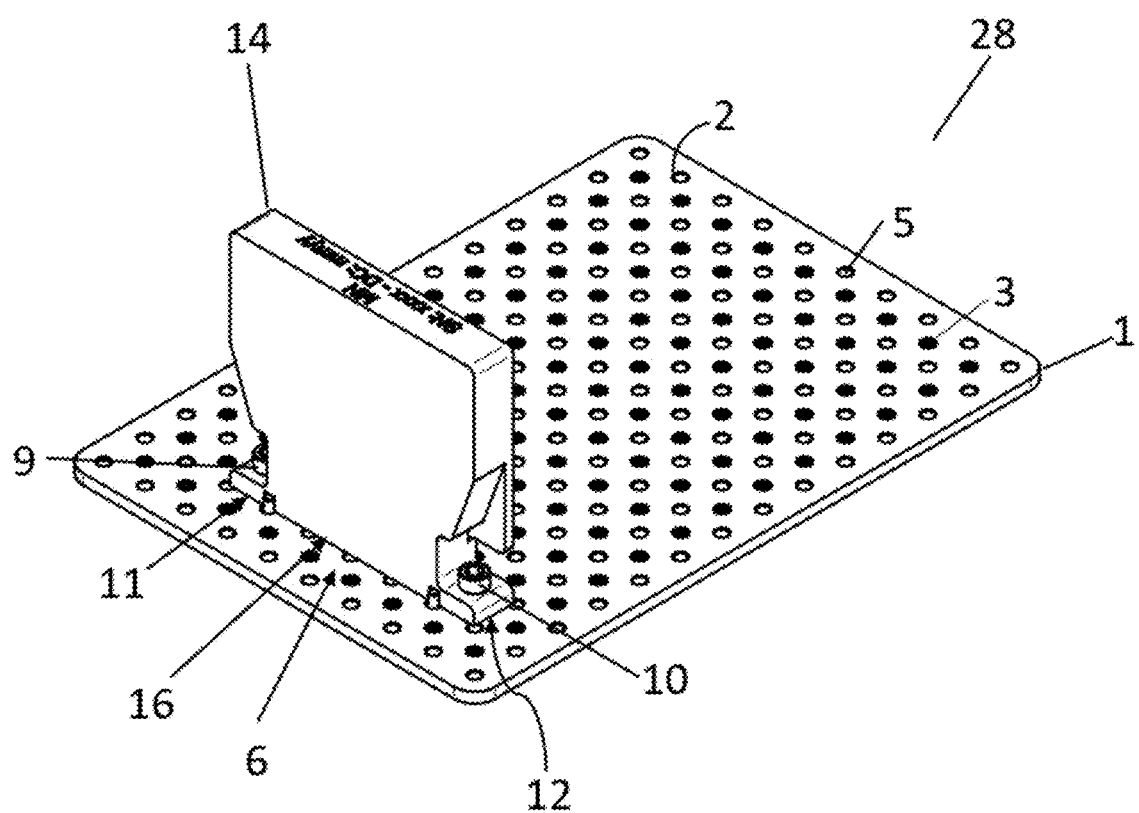
FIG. 5 is a front perspective view of an avionics system having a module connected to an integration plate.

FIG. 5 is a front perspective view of an avionics system 28 having a module 14 connected to an integration plate 1. The module 14 connects by module connection feature 6 having a first fastener 9 and a second fastener 10, wherein the first fastener 9 passes through a first connection hole 11 and the second fastener 10 passes through a second connection hole 12. In such an embodiment, the bottom face 16 of the module 14 abuts the mating surface 2 of the integration plate 1.

The module connection feature 6 provides structural contact of the module 14 with the integration plate 1. In some embodiments, the structural contact is of a strength to withstand accelerations of at least approximately 6 g, more preferably of at least approximately 9 g.

In some embodiments, the module connection feature 6 also provides thermal contact of the module 14 with the integration plate 1. This allows heat generated by the module 14 to dissipate into the integration plate 1. In some such embodiments, the thermal contact is created by the direct physical contact of a metal integration plate 1 with a metal module connection feature 6. Such thermal contact has any suitable thermal contact conductance coefficient. In some embodiments, the thermal contact has a thermal contact conductance coefficient greater than approximately 500 watts per square-meter per kelvin ("W/(m²·K)"), more preferably greater than approximately 3500 W/(m²·K).

In some embodiments in which the module connection feature 6 has an electrical connector 7, the integration plate 1 may have a through hole beneath the electrical connector 7 to allow electrical connection to the electrical connector 7.

Figure 6:
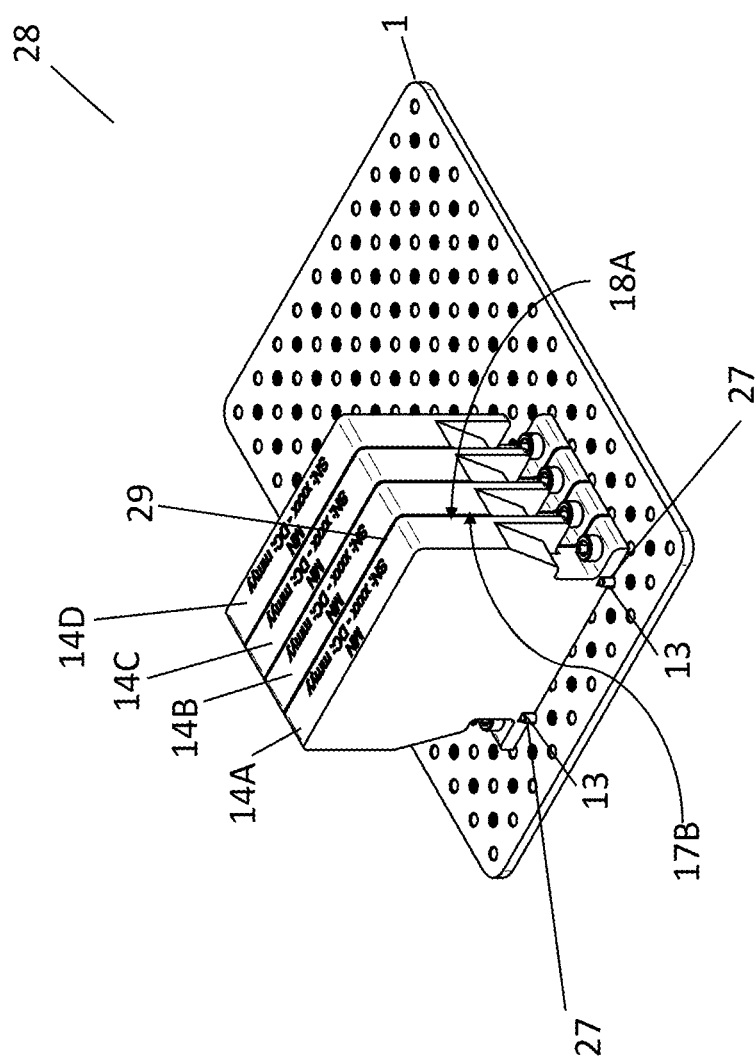
FIG. 6 is a front perspective view of an avionics system having four modules connected to an integration plate.

FIG. 6 is a front perspective view of an avionics system 28 having four modules 14A, 14B, 14C, 14D connected to an integration plate 1. The modules 14A, 14B, 14C, 14D and the integration plate 1 are so sized, shaped, and arranged that the modules 14A, 14B, 14C, 14D are each connected to the integration plate 1 with the back face 18A of a first module 14A neighbors the front face 17B of a second module 14B. In some embodiments the back face 18A of the first module 14A and the front face 17B of the second module 14B are separated by a non-zero-width gap 29 of less than approximately 0.25 inches and more preferably less than approximately 0.02 inches. The gap 29 may accommodate fabrication and machining tolerances, misalignment of modules, labels, coatings, or thermal expansions or any combination of the foregoing. The alignment recesses 27 are configured such that the first module 14A and second module 14B together abut alignment pins 13 that are proximate the gap 29. An avionics system 28 may have any suitable number of modules.

Figure 7:
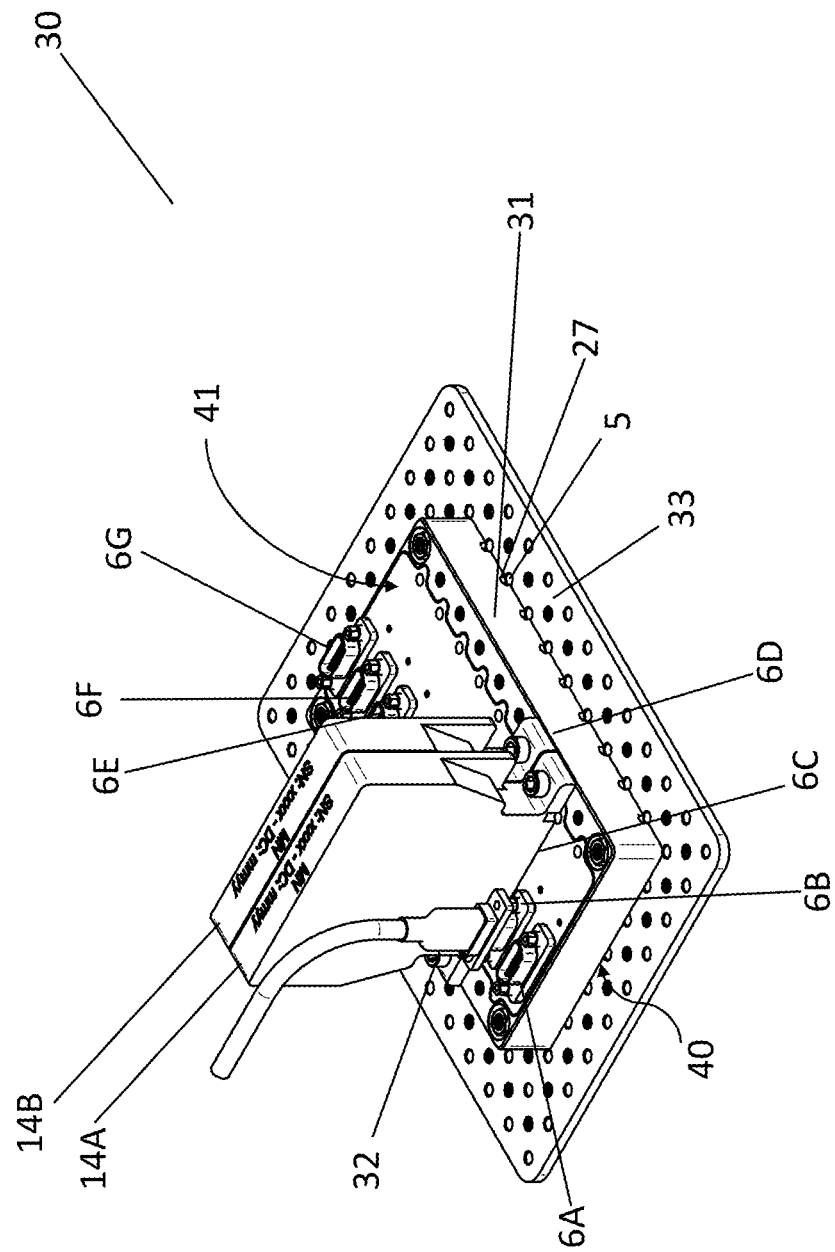
FIG. 7 is a front perspective view of an avionics system having a structural network switch connected to an integration plate, a wire harness connected to the structural network switch, and two modules connected to the structural network switch.

FIG. 7 is a front perspective view of an avionics system 30 having a structural network switch 31 connected to an integration plate 1, a wire harness 32 connected to the structural network switch 31, and two modules 14A, 14B connected to the structural network switch 31. The structural network switch has a foundation face 40 and a connection face 41. The structural network switch 31 may have alignment holes 5.

The structural network switch 31 provides on its connection face 41 a plurality of module connection features 6A, 6B, 6C, 6D, 6E, 6F, 6G—each for connecting to the structural network switch 31 either a module 14 or a wire harness 32. (Though only seven module connection features 6A, 6B, 6C, 6D, 6E, 6F, 6G are labelled on FIG. 7, it is apparent that the embodiment shown in FIG. 7 has additional module connection features which are obscured in FIG. 7 by other components of the system 30—including by the modules 14A, 14B.) Each module connection feature 6A, 6B, 6C, 6D, 6E, 6F, 6G may provide structural, electrical, thermal, or ingress-protective (or all or any combination of the foregoing) connections or seals between the structural network switch 31 and a module 14 or wire harness 32. The module connection features 6A, 6B, 6C, 6D, 6E, 6F, 6G are arranged such that modules 14 and wire harnesses 32 can be connected compactly to any of the module connection features 6A, 6B, 6C, 6D, 6E, 6F, 6G. In some embodiments modules 14 may be connected to the structural network switch 31 such that they are arranged as described above with reference to FIG. 6.

In some embodiments, the structural network switch 31 distributes power and data to, from, or among (or any combination thereof) modules 14 or wire harnesses 32 that are connected to the structural network switch 31. In some embodiments, the structural network switch 31 allows communication between modules 14 or wire harnesses 32. In some embodiments, the structural network device 31 provides managed access to power and connectivity for each module 14 or wire harness 32—for example, based on programmatic rules such as for security, authentication, behavior, resource prioritization, or fault protection.

The structural network switch 31 is connected at its foundation face 40 to the integration plate 1 by a switch mount feature 33. The switch mount feature 33 may be any suitable means of connecting (or mounting) the structural network switch 31 to the integration plate 1. In different embodiments, the switch mount feature 33 includes screw fasteners, or welding, or snap-fit fasteners. In some embodiments, as shown in FIG. 7, the switch mount feature 33 has alignment pins 13 that pass (or screw) into (or through) alignment holes 5 on the integration plate and into (or through) alignment recesses 27 on the switch mount feature 33. The switch mount feature 33 may provide structural, electrical, thermal, or ingress-protective (or all or any combination of the foregoing) connections or seals between the structural network switch 31 and the integration plate 1.

Figure 8:
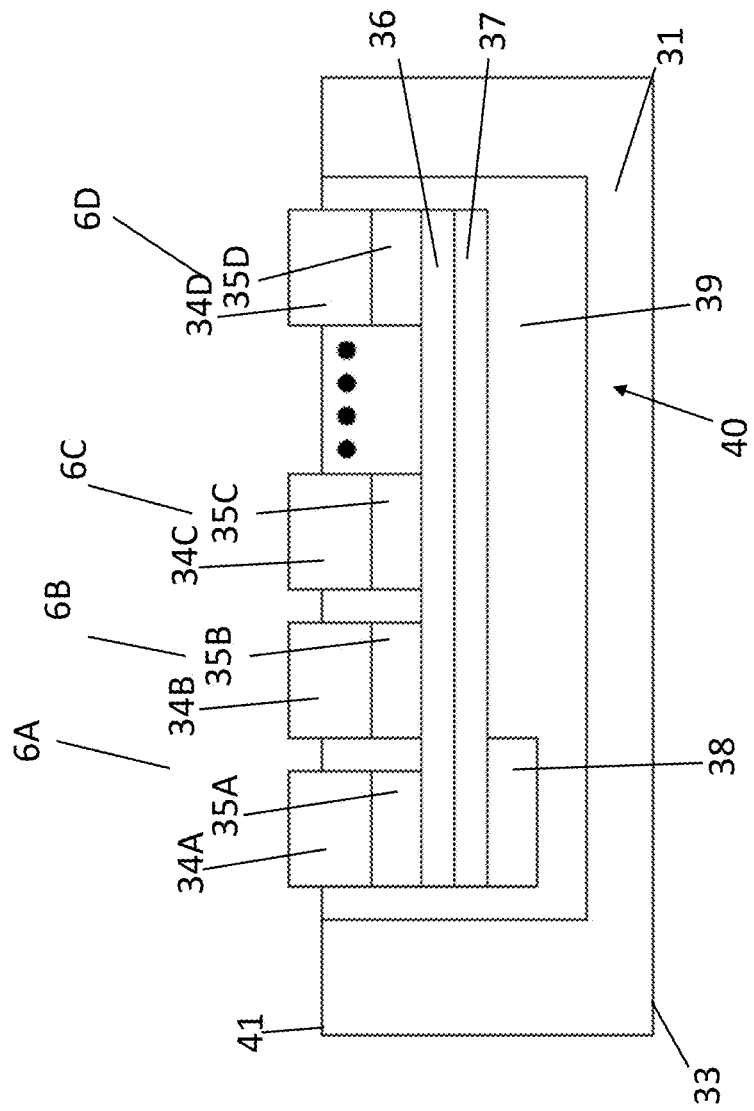
FIG. 8 is a functional diagram of a structural network switch.

FIG. 8 is a functional diagram of a structural network switch 31. The structural network switch 31 of FIG. 8 provides network connections 34A, 34B, 34C, 34D and circuit protections 35A, 35B, 35C, 35D at each module connection feature 6A, 6B, 6C, 6D. The structural network switch 31 of FIG. 8 provides power distribution 36 and data distribution 37 to all module connection features 6A, 6B, 6C, 6D. The structural network switch 31 of FIG. 8 provides network management functionality 38 and a data-and-power network system 39 to the avionics system 30. In other embodiments, a structural network switch 31 may have different functionality or configuration than is shown in FIG. 8.

Figure 9:
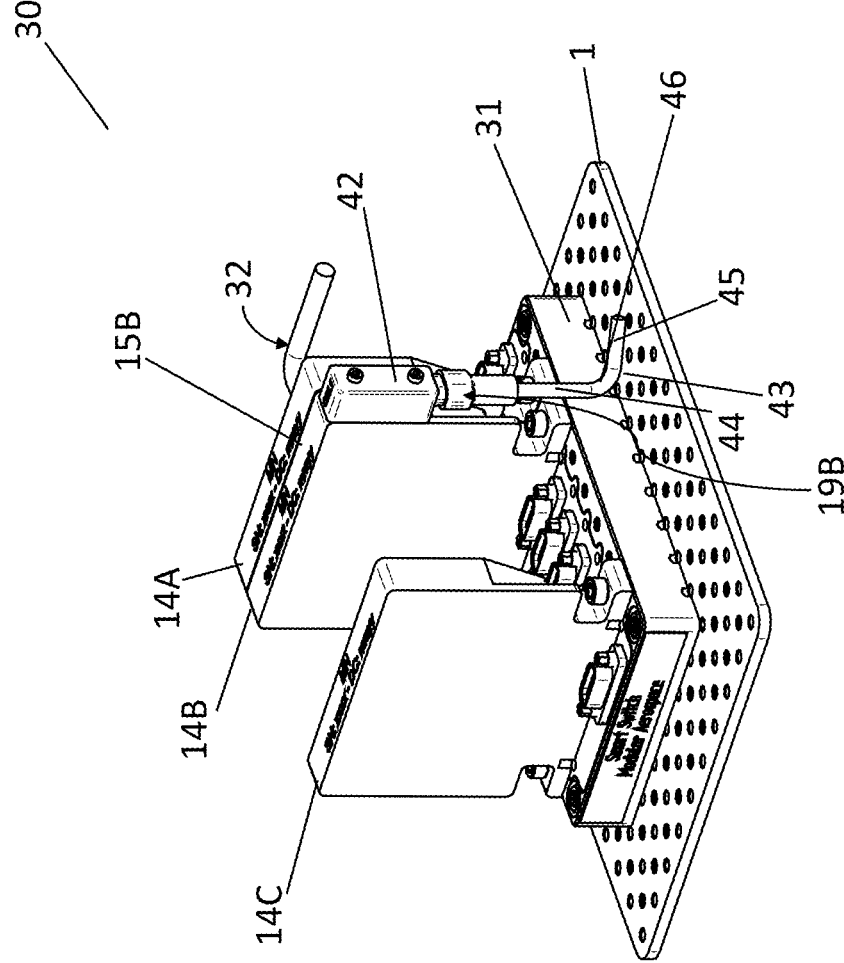
FIG. 9 is a back perspective view of an avionics system having a structural network switch connected to an integration plate, a wire harness connected to the structural network switch, three modules connected to the structural network switch, a lateral peripheral interface on one of the modules, and a peripheral interface cable connected to the lateral peripheral interface.

FIG. 9 is a back perspective view of an avionics system 30 having a structural network switch 31 connected to an integration plate 1, a wire harness 32 connected to the structural network switch 31, three modules 14A, 14B, 14C connected to the structural network switch 31, a lateral peripheral interface 42 on one of the modules (in this FIG. 9, module 14B), and a peripheral interface cable 43 connected to the lateral peripheral interface 42. The lateral peripheral interface provides structural and electrical connection of the peripheral interface cable 43 to the module 14B. The lateral peripheral interface 42 is positioned on the left face 19 of the module 14B, near the edge between the left face 19B and the top face 15B.

In some embodiments, as shown in FIG. 9, the peripheral interface cable 43 comprises a vertical section 44 and a horizontal section 45 that join in a cable juncture 46. The vertical section connects to the lateral peripheral interface 42. The vertical section 44 connects to the lateral peripheral interface 42 and runs proximate the module 14B. The horizontal section 45 runs away from the module 14B. The cable juncture 46 forms an angle of approximately 90 degrees. The cable juncture 46 is proximate the module 14B, for example to the edge between the left face 19 and the bottom face 16 of the module 14B. In some embodiments, the peripheral interface cable is positioned in the plane of the height 21 and the width 22 of the module 14B.

Figure 10A:
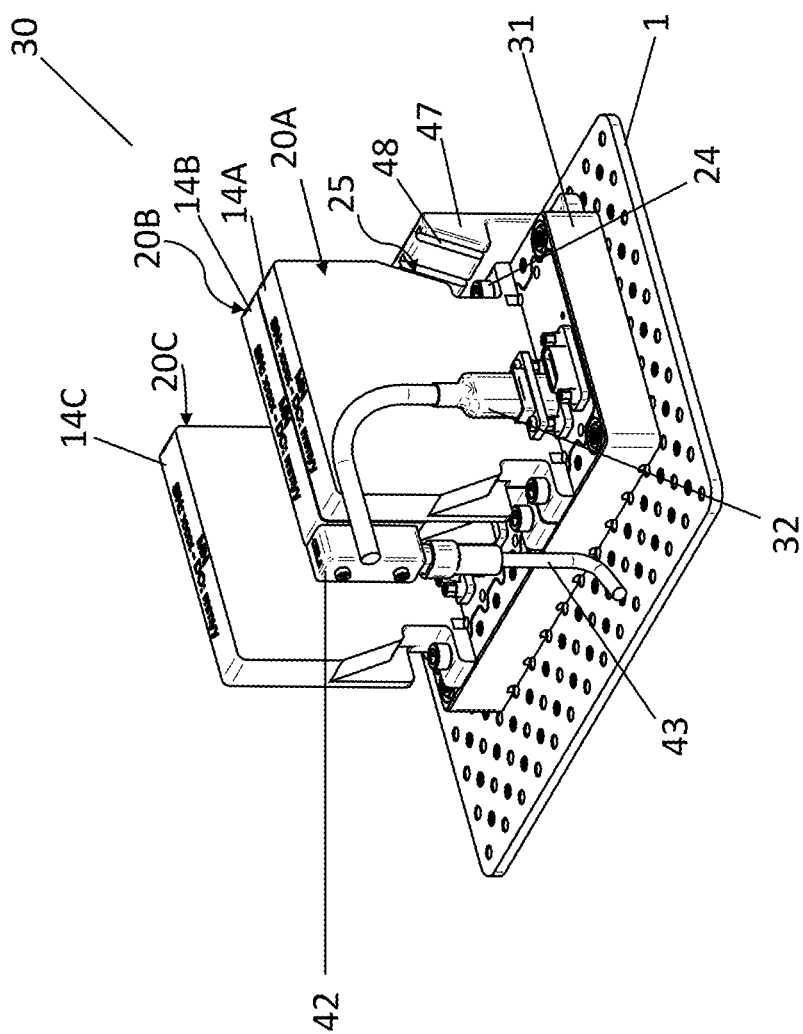
FIG. 10A is a front-left perspective view of an avionics system having a structural network switch connected to an integration plate, a wire harness connected to the structural network switch, three modules connected to the structural network switch, a lateral peripheral interface on one of the modules, a peripheral interface cable connected to the lateral peripheral interface, and a module structural relief device.

FIG. 10A is a front-left perspective view of an avionics system 30 having a structural network switch 31 connected to an integration plate 1, a wire harness 32 connected to the structural network switch 31, three modules 14A, 14B, 14C connected to the structural network switch 31, a lateral peripheral interface 42 on one of the modules (in this FIG. 10A, module 14B), a peripheral interface cable 43 connected to the lateral peripheral interface 42, and a module structural relief device 47.

The module structural relief device 47 provides structural support to the modules 14A, 14B, 14C. The module structural relief device 47 is made of any suitable hard material—e.g., metal, composite, or plastic. The module structural relief device 47 is connected to the integration plate 1 (for example, by screws). In some embodiments, the module structural relief device 47 is removably connected to the integration plate 1. The module structural relief device 47 abuts the modules 14A, 14B, 14C on one side—for example, as shown in FIG. 10A, on the right faces 20A, 20B, 20C of the modules 14A, 14B, 14C. The module structural relief device 47 is shaped to fit around the cutouts 24 and fins 25 of the modules 14A, 14B, 14C. In some embodiments, the module structural relief device 47 is shaped and dimensioned to accommodate at least one lateral peripheral interface 42 and/or peripheral interface cable 43—for example by being low-profile. The module structural relief device 47 has grooves 48. The grooves 48 are configured to receive the fins 25 of the modules 14A, 14B, 14C. This reception of the fins 25 by the grooves 48 provides structural support to the modules 14A, 14B, 14C.

Figure 10B:
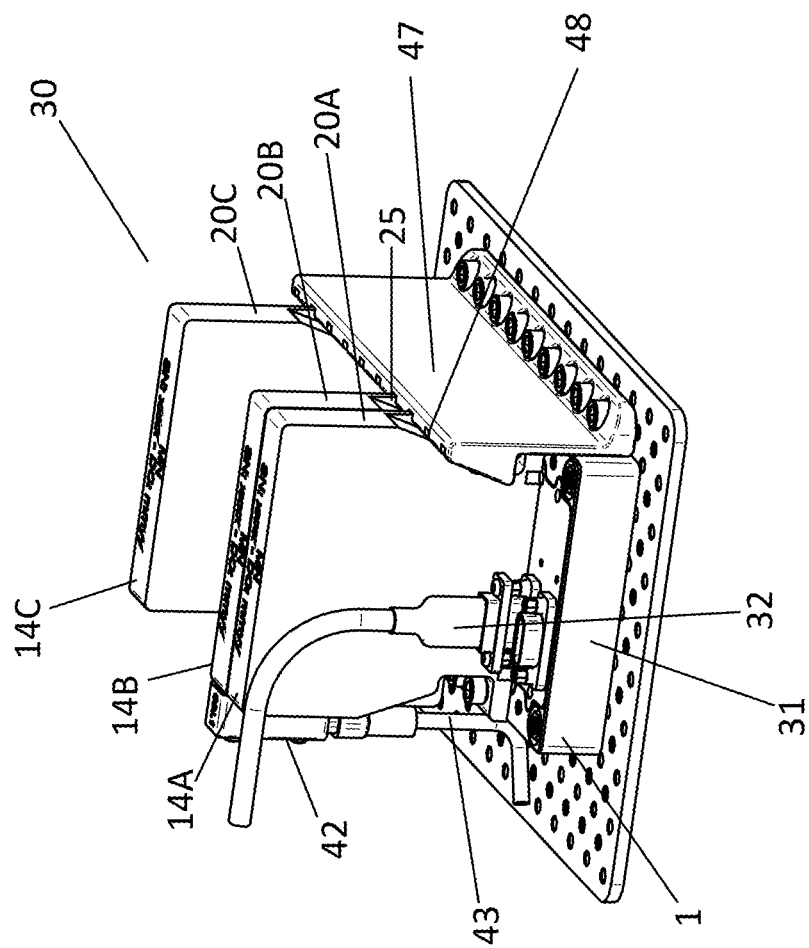
FIG. 10B is a front-right perspective view of an avionics system having a structural network switch connected to an integration plate, a wire harness connected to the structural network switch, three modules connected to the structural network switch, a lateral peripheral interface on one of the modules, a peripheral interface cable connected to the lateral peripheral interface, and a module structural relief device.

FIG. 10B is a front-right perspective view of an avionics system 30 having a structural network switch 31 connected to an integration plate 1, a wire harness 32 connected to the structural network switch 31, three modules 14A, 14B, 14C connected to the structural network switch 31, a lateral peripheral interface 42 on one of the modules (in this FIG. 10B, module 14B), a peripheral interface cable 43 connected to the lateral peripheral interface 42, and a module structural relief device 47.

Figure 11A:
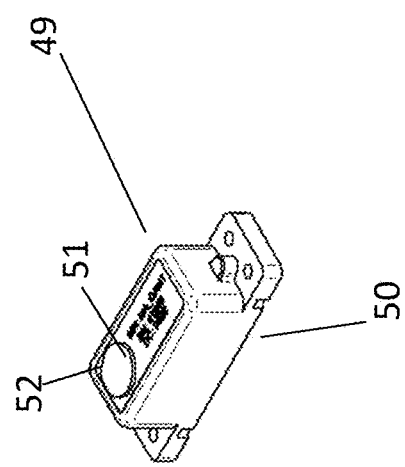
FIG. 11A is a top perspective view of an image sensing module.

FIG. 11A is a top perspective view of an image sensing module 49. The image sensing module 49 is a kind of module 14. It has a module connection feature 50 for connection onto an integration surface 1 or onto the connection face 41 of a structural network switch 31. An image sensing module 49 further comprises an image sensor 51 which may in some embodiments include a lens 52.

Figure 11C:
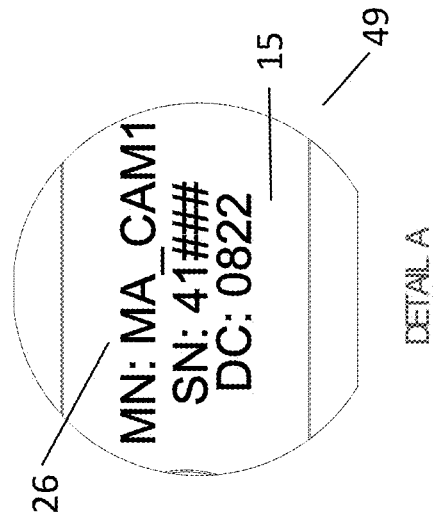
FIG. 11C is a detail view of the image sensing module of FIG. 11B.
Figure 11B:
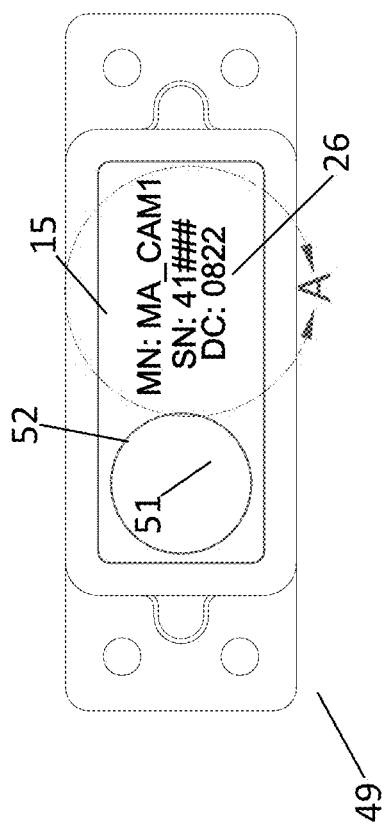
FIG. 11B is a top view of an image sensing module.

FIG. 11B is a top view of an image sensing module 49. The top face 15 of the image sensing module 49 may bear a label 26.

FIG. 11C is a detail view of the image sensing module 49 of FIG. 11B, showing the label 26 in detail.

Figure 11D:
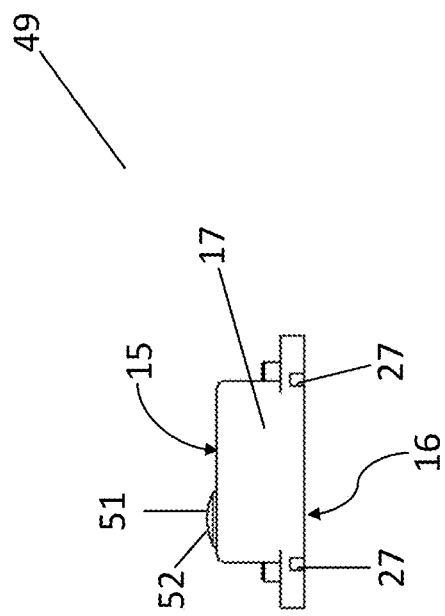
FIG. 11D is a front view of an image sensing module.

FIG. 11D is a front view of an image sensing module 49.

Figure 11E:
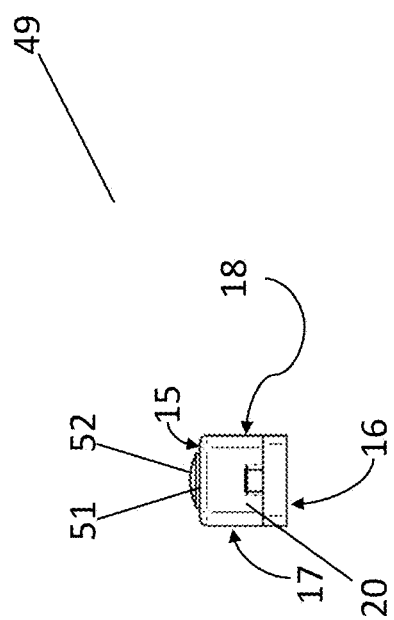
FIG. 11E is a right-side view of an image sensing module.

FIG. 11E is a right-side view of an image sensing module 49.

Figure 11F:
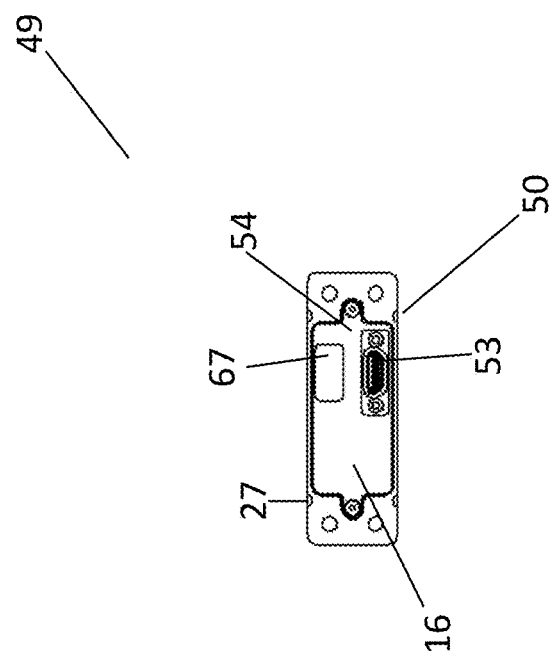
FIG. 11F is a bottom view of an image sensing module.

FIG. 11F is a bottom view of an image sensing module 49. In some embodiments, the module connection feature 50 has an electrical connector 53.

Figure 11G:
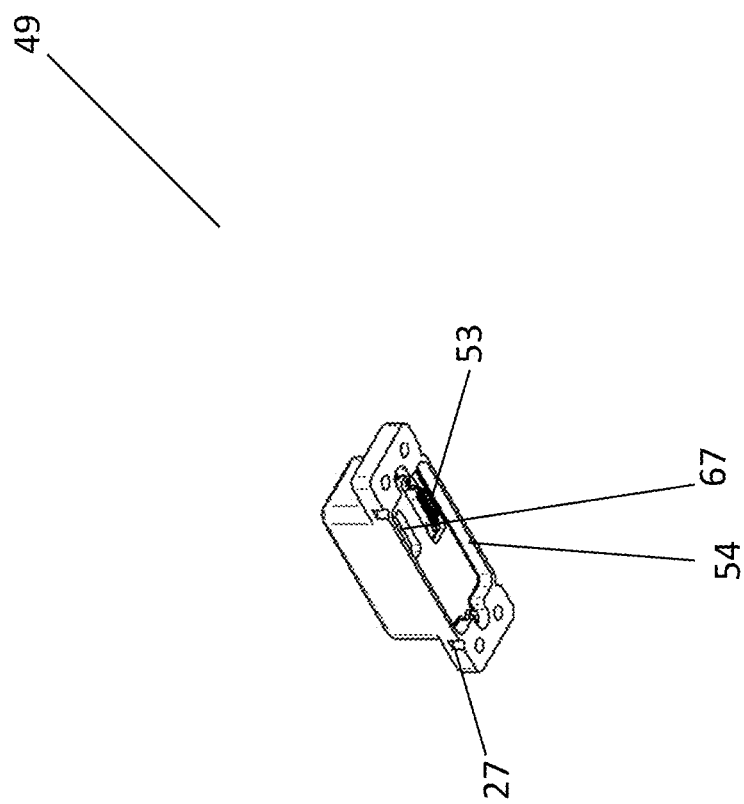
FIG. 11G is a bottom perspective view of an image sensing module.

FIG. 11G is a bottom perspective view of an image sensing module 49. In some embodiments, the image sensing module 49 has a recess 54 to receive the environmental seal (not specifically shown in FIG. 11G).

Figure 12A:
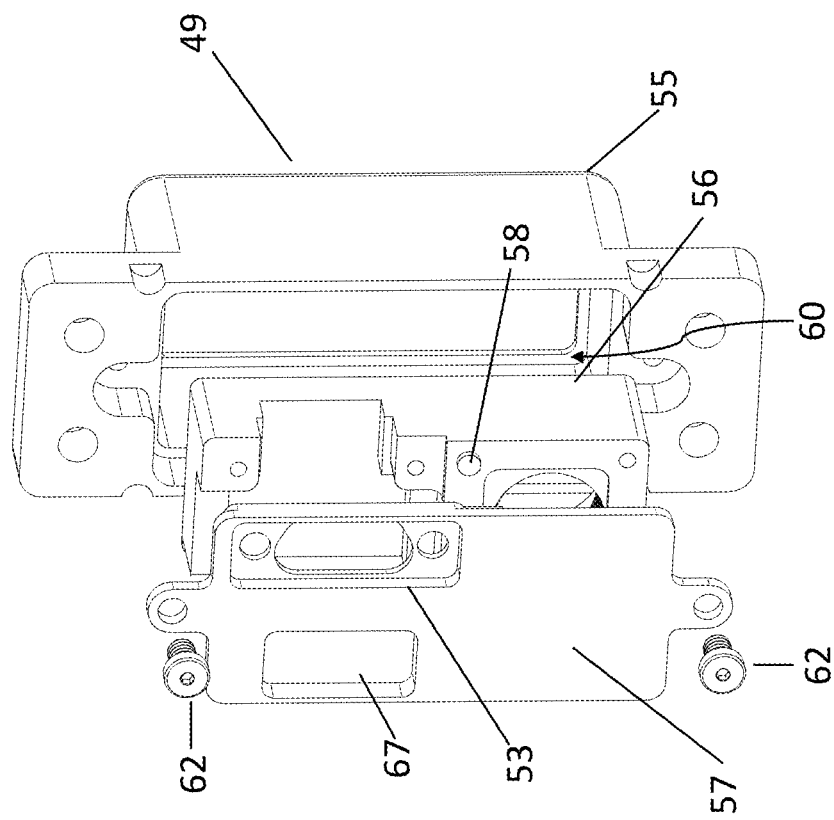
FIG. 12A is an exploded bottom perspective view of an image sensing module.

FIG. 12A is an exploded bottom perspective view of an image sensing module 49. The image sensing module 49 comprises an outer body 55, an inner body 56, and a lower cover 57.

The outer body 55 provides structural, thermal, and ingress-protective connection with an integration surface 1, structural network switch 31, or other mounting surface.

The inner body 56 supports the image sensor 51, lens 52, and/or other electrical or electronic hardware. Circular bosses 58 allow for precision alignment of hardware mounted to the inner body 56. A flange 59 on the inner body 56 engages with a lip 60 on the outer body 55, with clearance for the environmental seal; in some embodiments, this feature allows for expansion of the inner volume of the image sensing module 49 due to heating or due to comparatively low external pressure; in some embodiments, this feature provides structural and/or thermal connection between the outer body 55 and the inner body 56.

The lower cover 57 keeps the inner body 56 substantially within the outer body 55. In some embodiments, the lower cover provides a thermal connection with the inner body 56. In some embodiments, the lower cover provides an electrical connection with the image sensor 51 or other electrical hardware in the image sensing module 49. Raised features 61 on the lower cover 57 engage the bosses 58 on the inner body 56; in some embodiments, this feature provides structural and/or thermal connection between the outer body 55 and the inner body 56. In some embodiments, cover fasteners 62 connect the lower cover 57 to the outer body 55; in some such embodiments, this is done without interfering with the electrical connector 53 or the environmental seal. To accommodate the larger footprint of an image sensing module 49 (compared to the footprint of the embodiment of a module 14 described with reference to FIG. 4A), the lower cover 57 has a material keepout hole 67 which can receive an unused module connection feature 6.

Figure 12B:
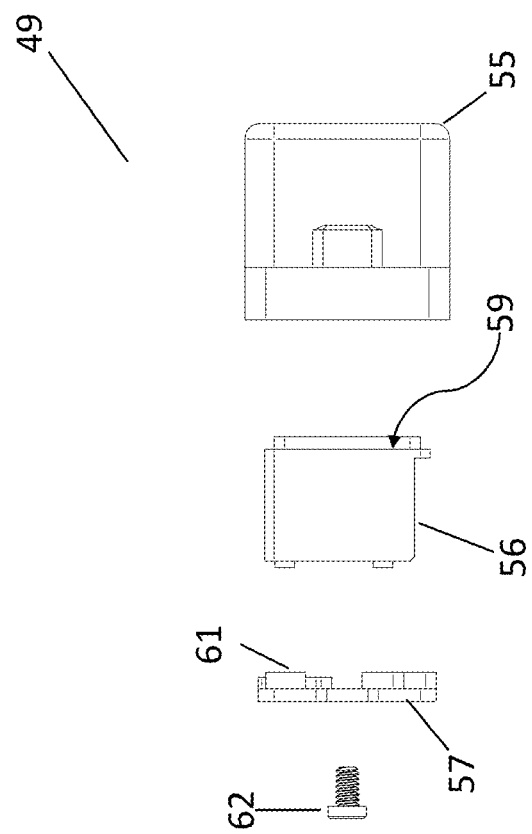
FIG. 12B is an exploded side view of an image sensing module.

FIG. 12B is an exploded side view of an image sensing module 49.

Figure 13:
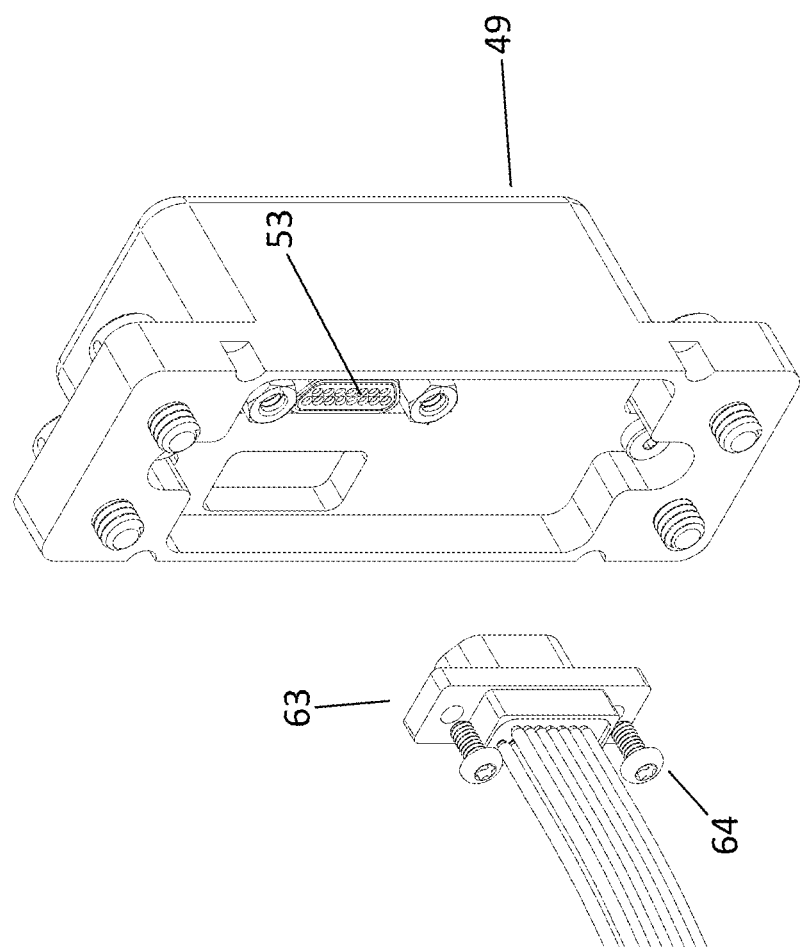
FIG. 13 is a bottom perspective view of an image sensing module and a wire harness.

FIG. 13 is a bottom perspective view of an image sensing module 49 and a wire harness 63. In some embodiments, the wire harness 63 provides an electrical connection to the image sensing module 49. Appropriate harness fasteners 64 connect the wire harness 63 to the image sensing module 49.

Figure 14:
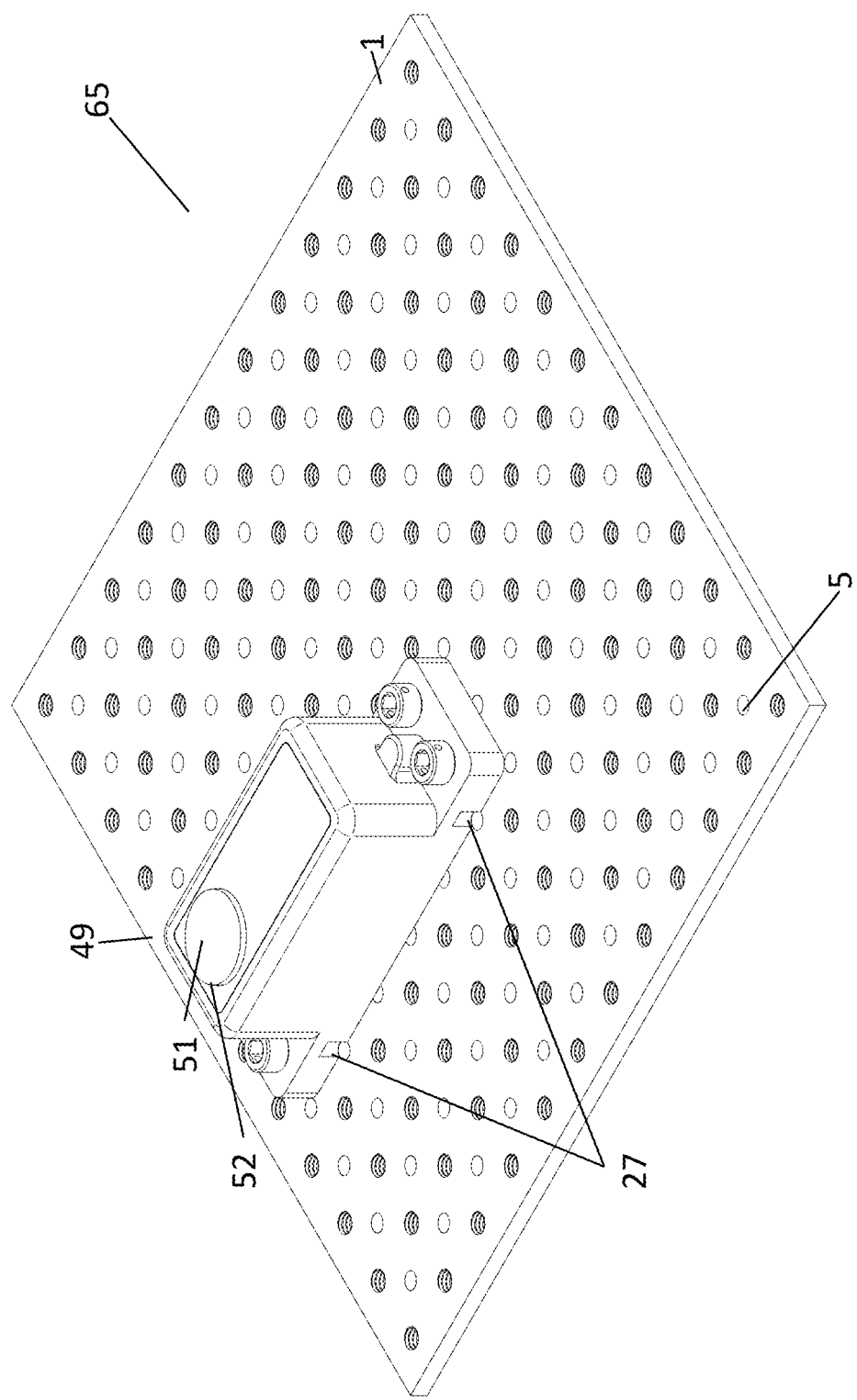
FIG. 14 is a top perspective view of an avionics system having an image sensing module connected to an integration plate.

FIG. 14 is a top perspective view of an avionics system 65 having an image sensing module 49 connected to an integration plate 1. In some embodiments, the image sensing module 49 comprises alignment recesses 27 for receiving alignment pins 13 that pass (or screw) into (or through) alignment holes 5.

FIG. 15 is a top perspective view of an avionics system 66 having a structural network switch 31 connected to an integration plate 1, a module 14 connected to the structural network switch 31, and an image sensing module 49 connected to the structural network switch 31. In some embodiments, the image sensing module 49 connects to a first module connection feature (not specifically shown in FIG. 15) and covers a second module connection feature (not specifically shown in FIG. 15). Thus it takes up twice as much footprint as the module 14 of FIG. 15.

Figure 16A:
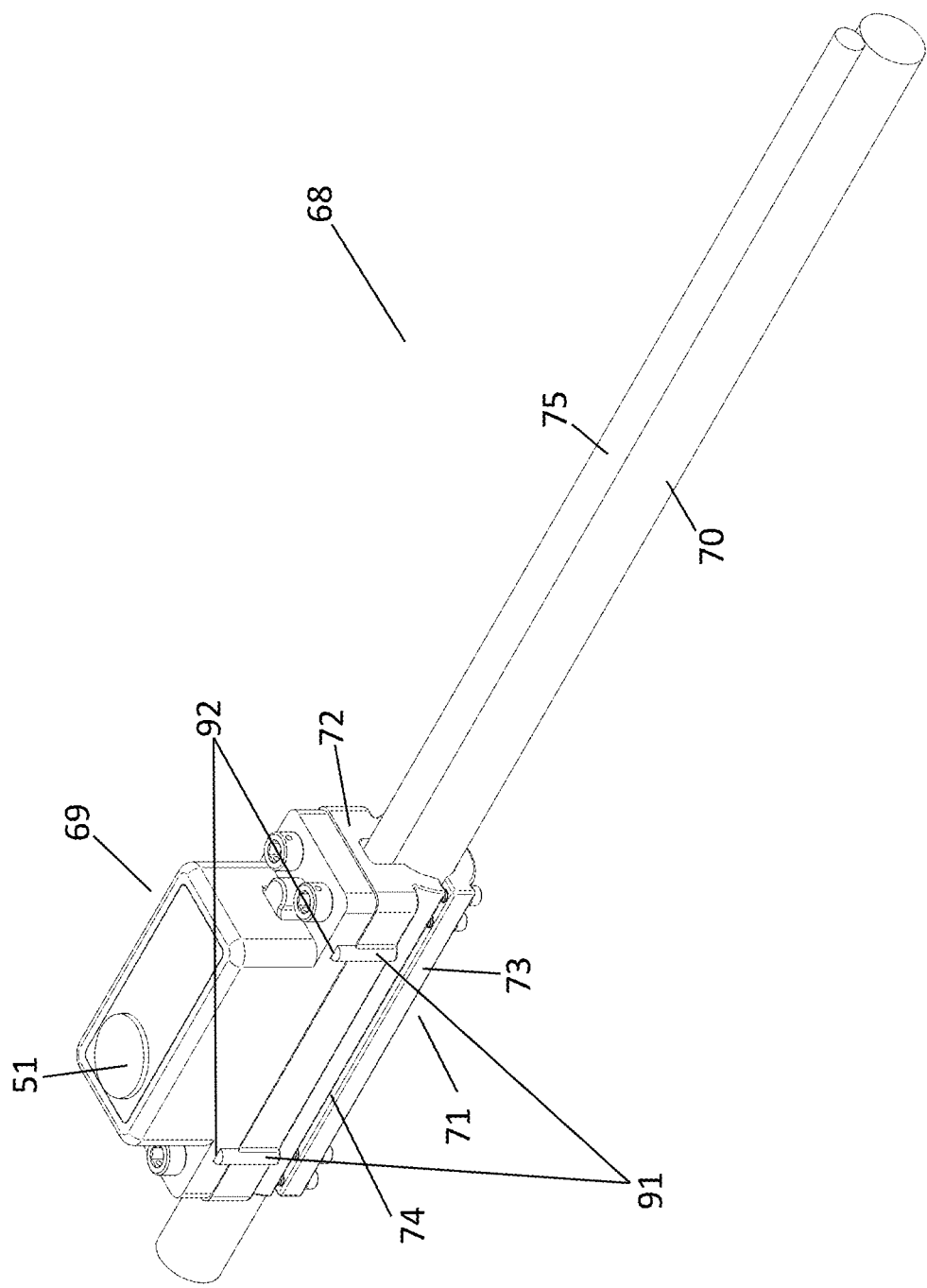
FIG. 16A is top perspective view of an avionics system having an image sensing module mounted on a rod.

FIG. 16A is top perspective view of an avionics system 68 having an image sensing module 69 mounted on a rod 70. The rod 70 might be a strut on an aircraft, spacecraft, or other vehicle—for example a strut for supporting structural load. The image sensing module 69 attaches to the rod 70 (for example, a small-diameter rod) without adding excessive height or depth to the system 68. The image sensing module 69 has an integration plate rod adapter 71 (or 'collar'). In some embodiments, the integration plate rod adapter 71 is a structural and/or thermal connection between the image sensing module 69 and the rod 70. The integration plate rod adapter 71 has an upper part 72 and a lower part 73. The rod 70 is received by a clearance gap 74 between the upper part 72 and the lower part 73. The height of the clearance gap 74 is adjustable to accommodate different sized rods 70. In some embodiments, the clearance gap 74 also accommodates an environmental seal or a friction ('non-slip') surface or another coating of the rod 70. In some embodiments, as shown in FIG. 16A, the clearance gap 74 accommodates an electrical cable 75 that runs along the rod 70. In some embodiments, the rod 70 may have a rotational-alignment pin (not specifically shown in FIG. 16A) which is received by the image sensing module 69. In some embodiments, the rod 70 has rotational alignment detents (not specifically shown in FIG. 16A). Similarly to the alignment pins 13 described above with reference to FIG. 2, the integration plate rod adapter 71 has, in some embodiments, alignment pins 91 which are received by alignment recesses 92 on the image sensing module 69.

Figure 16B:
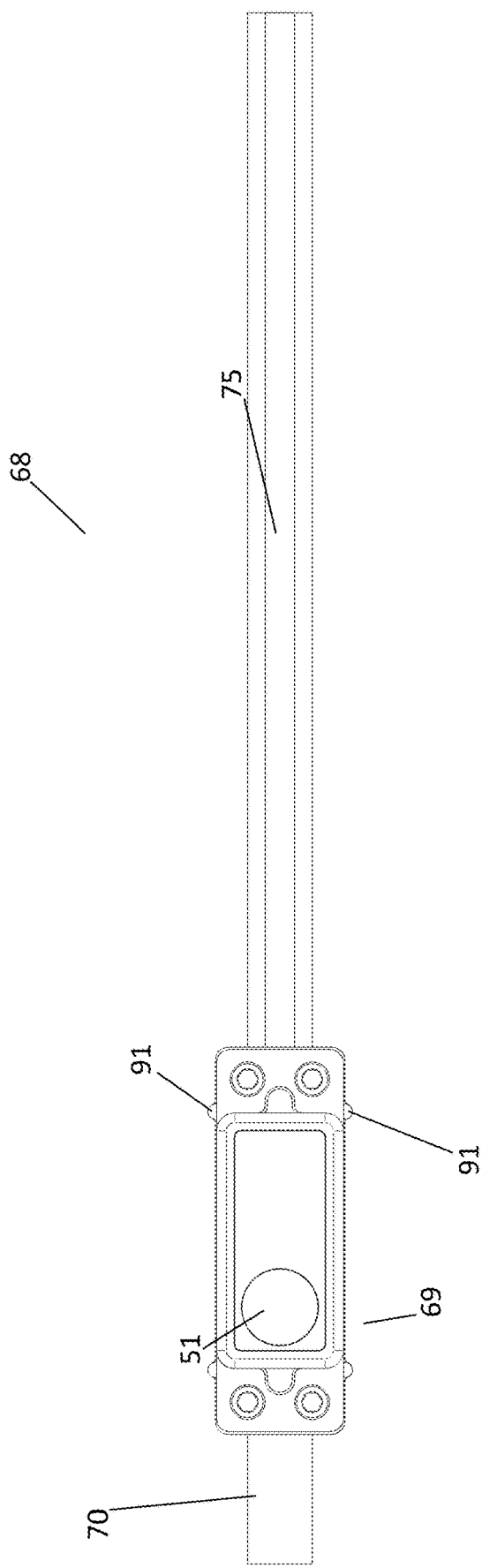
FIG. 16B is a top view of an avionics system having an image sensing module mounted on a rod.

FIG. 16B is a top view of an avionics system 68 having an image sensing module 69 mounted on a rod 70.

Figure 16C:
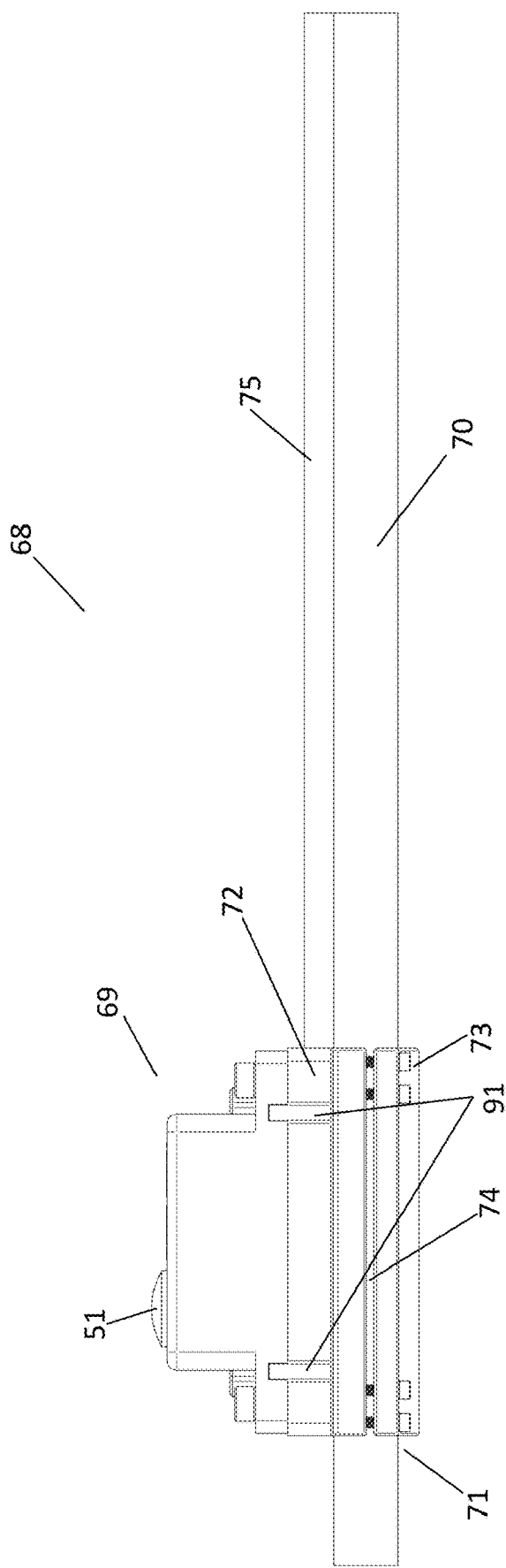
FIG. 16C is a front view of an avionics system having an image sensing module mounted on a rod.

FIG. 16C is a front view of an avionics system 68 having an image sensing module 69 mounted on a rod 70.

Figure 16D:
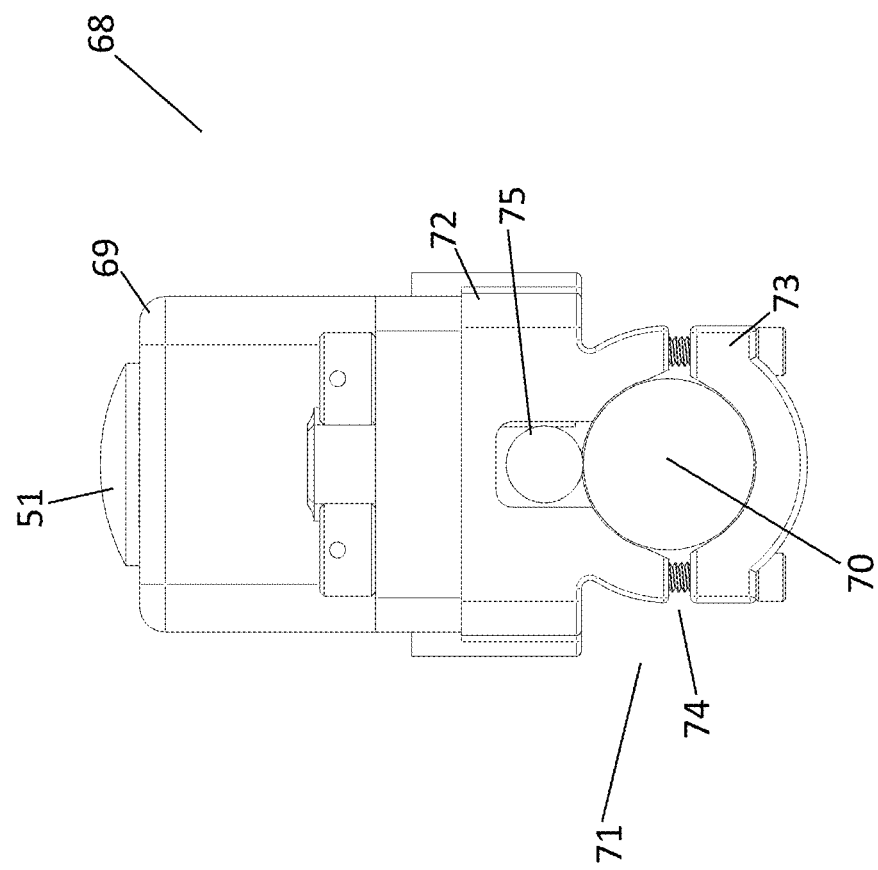
FIG. 16D is a side view of an avionics system having an image sensing module mounted on a rod.

FIG. 16D is a side view of an avionics system 68 having an image sensing module 69 mounted on a rod 70.

Figure 17:
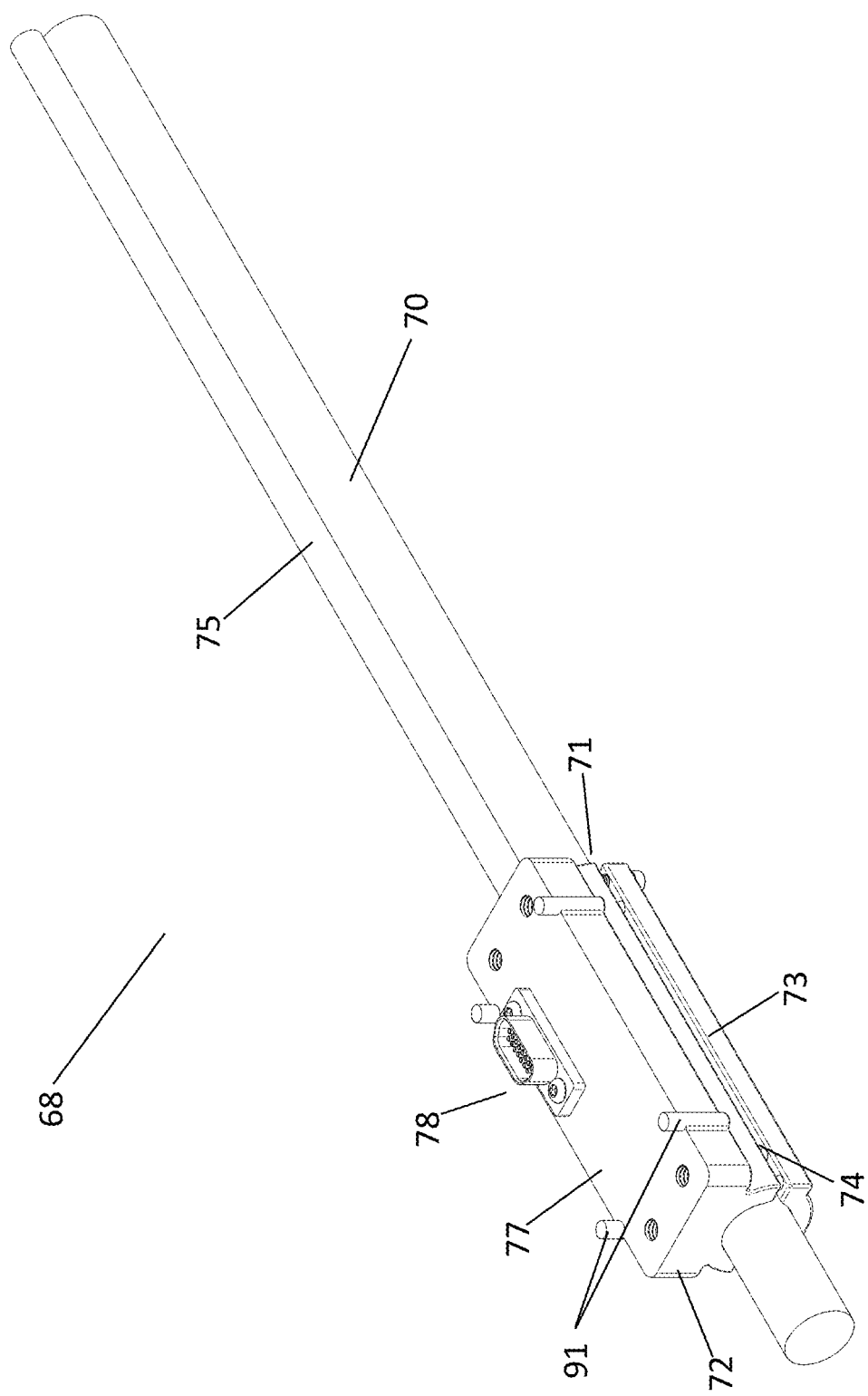
FIG. 17 is a top perspective view of an avionics system having an integration plate rod adapter mounted on a rod.

FIG. 17 is a top perspective view of an avionics system 68 having an integration plate rod adapter 71 mounted on a rod 70. The integration plate rod adapter 71 has a mounting face 77. In some embodiments, the mounting face 77 allows for easier alignment, increased contact area (for example, for structural or thermal connection), and/or an area for fasteners. In some embodiments the mounting face 77 provides a module connection feature 78. In some embodiments the module connection feature 78 is as described above with respect to FIGS. 2-15. In some embodiments, the mounting face 77 is a structural and/or thermal connection between the lower cover (not shown in FIG. 17) of the image sensing module 69 and the integration plate rod adapter 71.

Figure 18A:
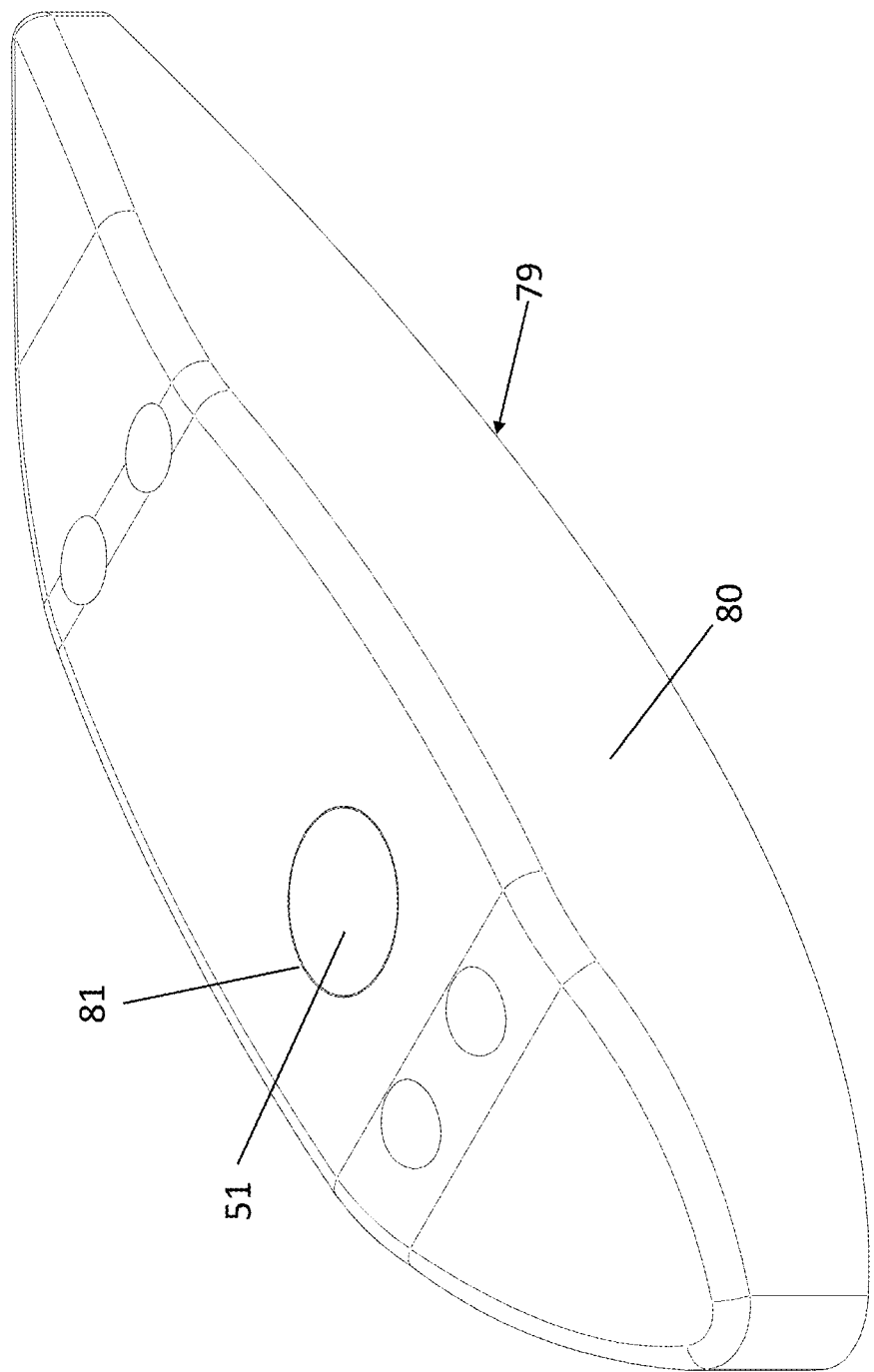
FIG. 18A is a top perspective view of an image sensing module in an encasement.

FIG. 18A is a top perspective view of an image sensing module 79 in an encasement 80. The encasement 80 may be any suitable encasement. An encasement (including, for example, encasement 80) may enclose any suitable module, whether or not an image sensing module. The following figures describe an encasement 80 in the context of image sensing module 79. But no limitation of the current invention is intended thereby. A person of skill in the art will understand from the current disclosure that an encasement (including encasement 80) could be advantageously designed and/or adapted for use with any desired module. For example, a radio antenna module could be encased in an encasement. In some embodiments, the encasement 80 has an aerodynamically favorable shape. In some embodiments, the encasement 80 shields the image sensing module 79 from the environment (for example, from the environment of an aircraft's or launch vehicle's in-flight freestream). The encasement 80 has a lens hole 81 to minimize interference with the field of view of the image sensing module 79.

Figure 18B:
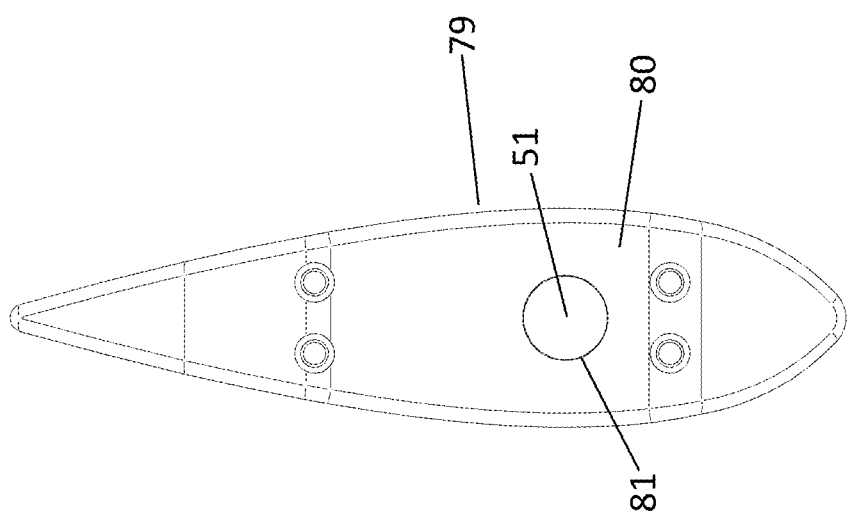
FIG. 18B is a top view of an image sensing module in an encasement.

FIG. 18B is a top view of an image sensing module 79 in an encasement 80.

Figure 18C:
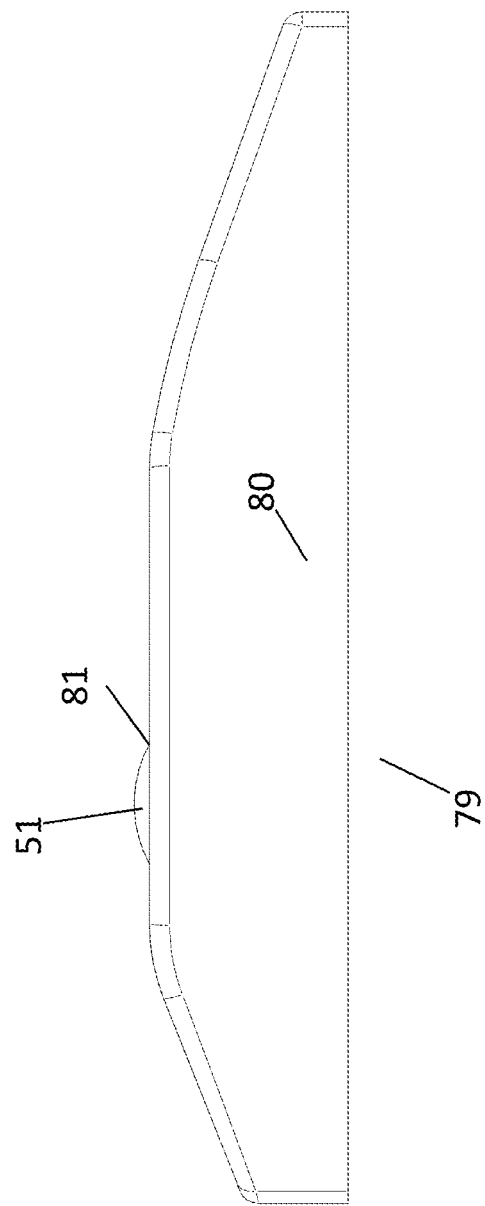
FIG. 18C is a front view of an image sensing module in an encasement.

FIG. 18C is a front view of an image sensing module 79 in an encasement 80.

Figure 18D:
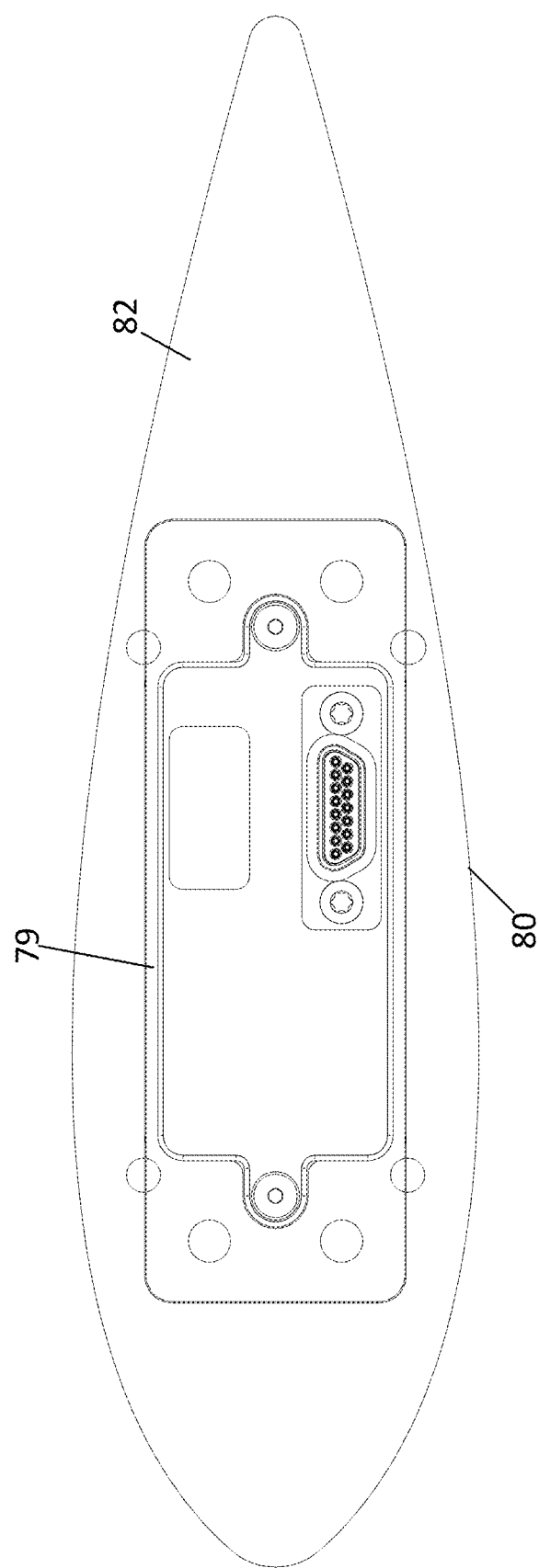
FIG. 18D is a bottom view of an image sensing module in an encasement.

FIG. 18D is a bottom view of an image sensing module 79 in an encasement 80. In some embodiments, as shown in FIG. 18D, the lower surface 82 of the encasement 80 accommodates connection of the image sensing module 79 to a surface by a module connection feature 83. In some embodiments, the lower surface 82 itself provides a module connection feature. In some embodiments, the lower surface 82 allows for easier alignment, increased contact area (for example, for structural or thermal connection), and/or an area for fasteners. In some embodiments the module connection feature 83 is as described above with respect to FIGS. 2-17.

In some embodiments, the lower surface 82 is a structural and/or thermal connection between the lower cover (not shown in FIG. 17) of the image sensing module 79 and the encasement 80 or the surface onto which the encasement 80 is to be mounted—for example, an aircraft's or spacecraft's skin or structural elements, e.g., wing (as described below with reference to FIGS. 19A-F), rib, or hardpoint. In some embodiments, the lower surface 82 is affixed to a integration plate with a flexible mounting point which conforms to such a surface onto which the encasement 80 is to be mounted.

Figure 18E:
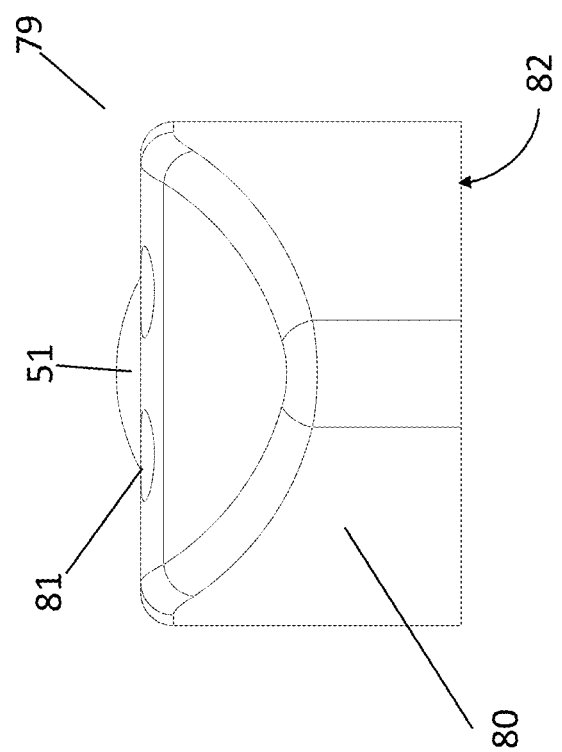
FIG. 18E is a side view of an image sensing module in an encasement.

FIG. 18E is a side view of an image sensing module 79 in an encasement 80.

Figure 19A:
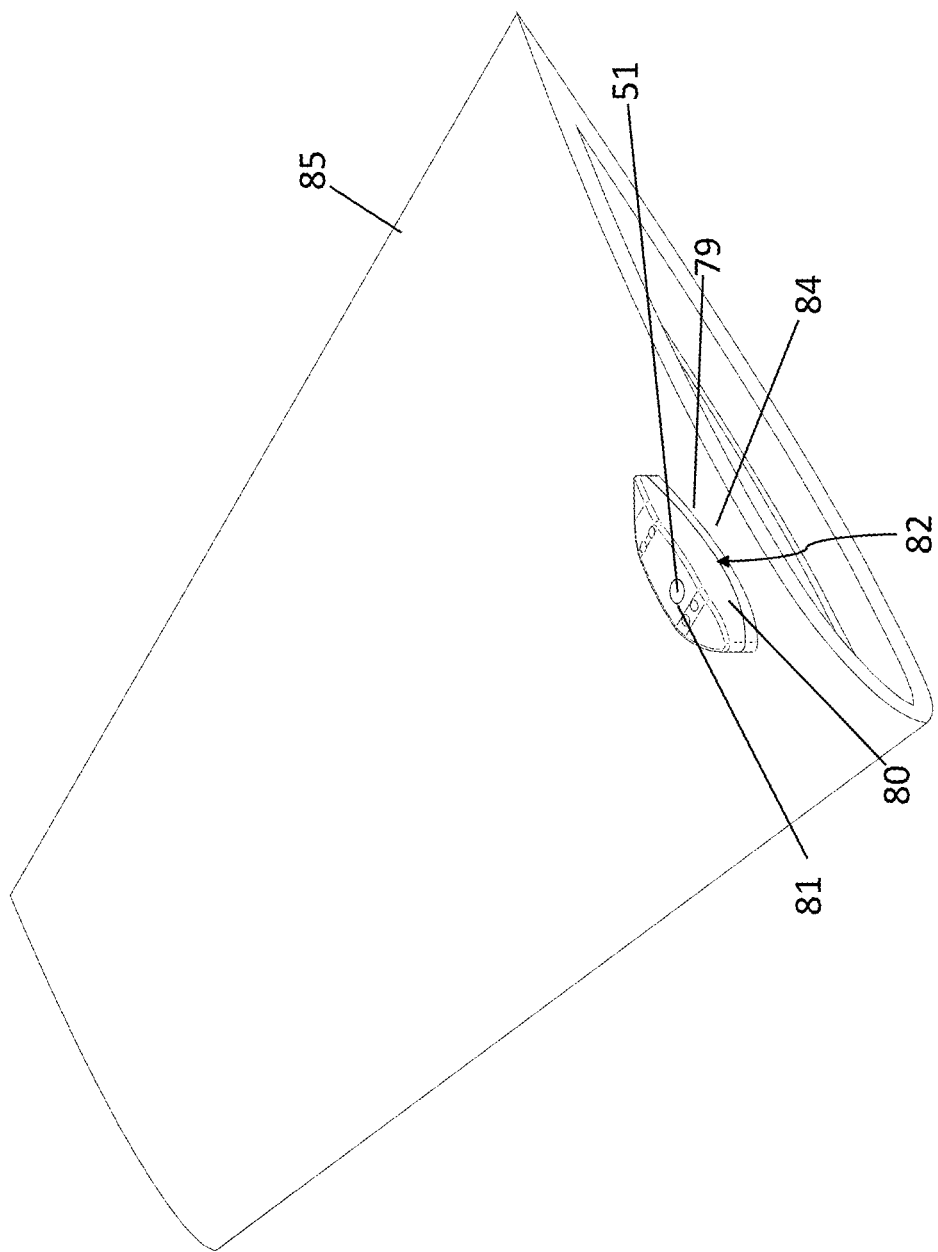
FIG. 19A is a top perspective view of an avionics system having an image sensing module in an encasement as mounted on a wing.

FIG. 19A is a top perspective view of an avionics system 84 having an image sensing module 79 in an encasement 80 as mounted on a wing 85. The lower surface 82 is a structural and/or thermal connection between the lower cover (not shown in FIG. 17) of the image sensing module 79 or the encasement 80 and the wing 85. In some embodiments, the lower surface 82 is affixed to a flexible mounting point which conforms to the irregular surface of the wing 85.

Figure 19C:
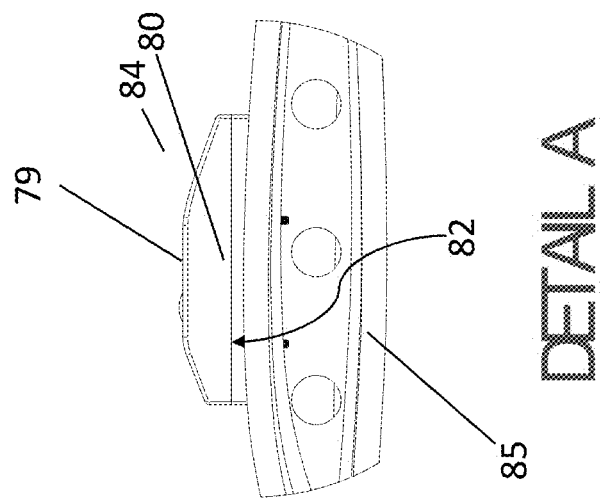
FIG. 19C is a detail view of the avionics system of FIG. 19B.
Figure 19B:
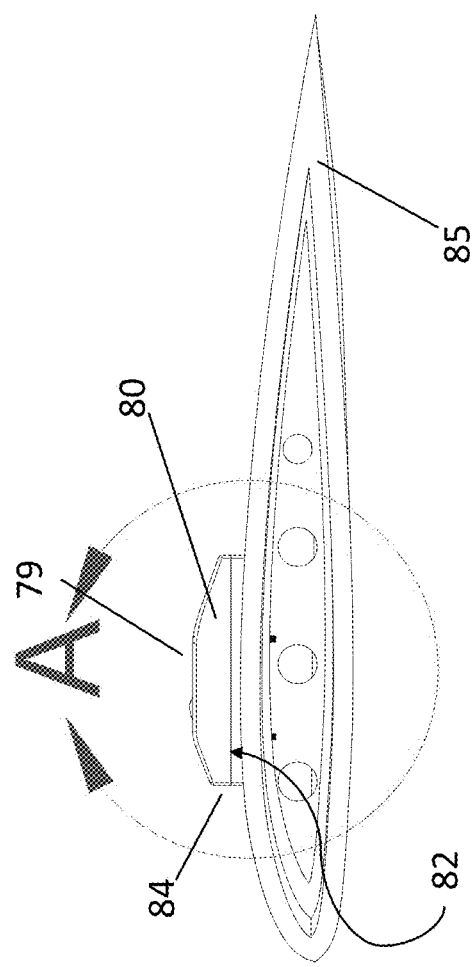
FIG. 19B is a front view of an avionics system having an image sensing module in an encasement as mounted on a wing.

FIG. 19B is a front view of an avionics system 84 having an image sensing module 79 in an encasement 80 as mounted on a wing 85.

FIG. 19C is a detail view of the avionics system of FIG. 19B.

Figure 19E:
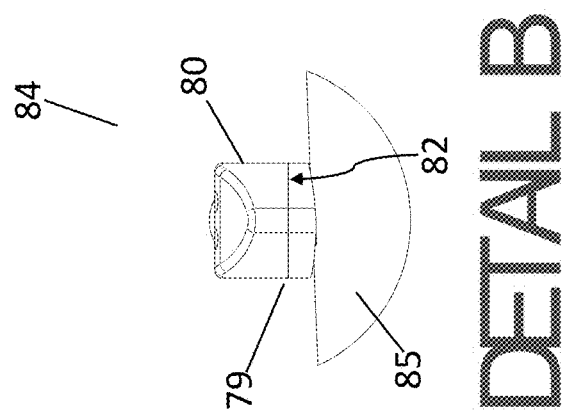
FIG. 19E is a detail view of the avionics system of FIG. 19D.
Figure 19D:
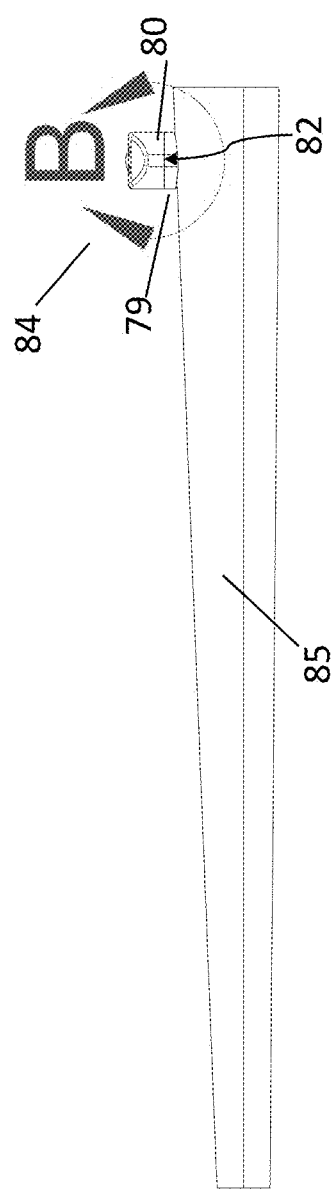
FIG. 19D is a side view of an avionics system having an image sensing module in an encasement as mounted on a wing.

FIG. 19D is a side view of an avionics system 84 having an image sensing module 79 in an encasement 80 as mounted on a wing 85.

FIG. 19E is a detail view of the avionics system of FIG. 19D.

FIG. 19F is a top view of an avionics system 84 having an image sensing module 79 in an encasement 80 as mounted on a wing 85.

Figure 20A:
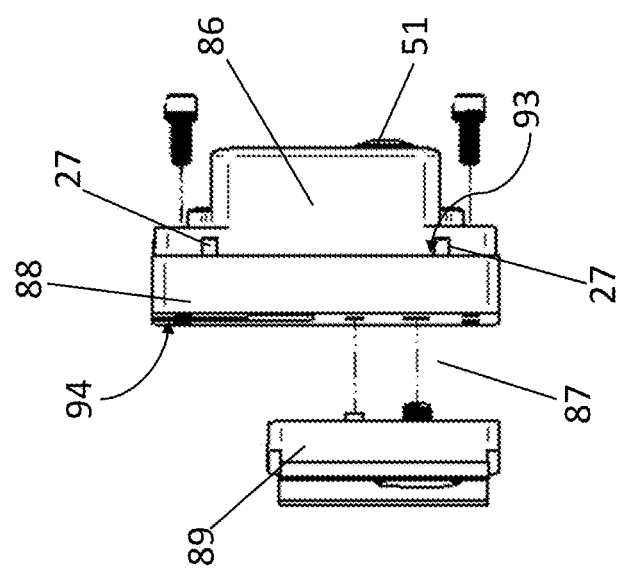
FIG. 20A is an exploded front view of an image sensing module, an integration plate tripod adapter, and a removable fixture having a tripod interface.

FIG. 20A is an exploded front view of an image sensing module 86, an integration plate tripod adapter 88, and a removable fixture 87 having a tripod interface 89 (for example, as shown in FIG. 20A, a tripod interface compatible with ISO 1222:2010 or another industry-standard tripod interface). The integration plate tripod adapter 88 has an upper interface 93 for module fixturing and a lower interface 94 compatible with the tripod interface 89. The image sensing module 86 structurally and/or thermally connects to the integration plate tripod adapter 88 (for example, as it would connect to the integration surface 1 or structural network device 31 as described above with reference to FIGS. 14-15). The upper adapter 88 connects to the lower adapter 89 in any suitable fashion.

Figure 20B:
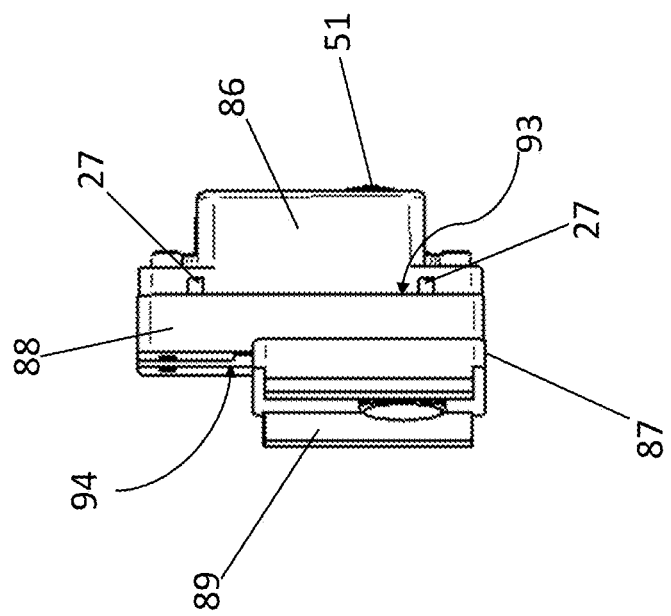
FIG. 20B is a front view of an image sensing module, an integration plate tripod adapter, and a removable fixture having a tripod interface.

FIG. 20B is a front view of an image sensing module 86, an integration plate tripod adapter 88, and a removable fixture 87 having a tripod interface 89.

Figure 21A:
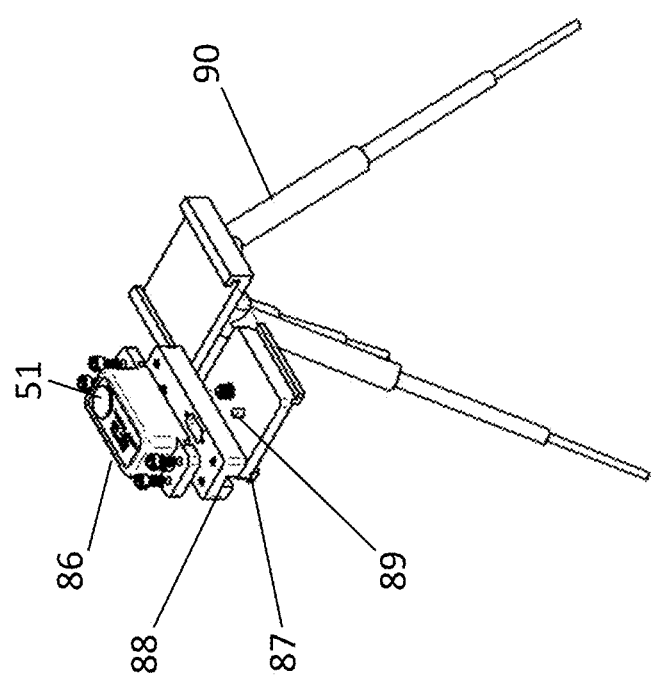
FIG. 21A is an exploded top perspective view of an image sensing module, an integration plate tripod adapter, and a removable fixture having a tripod interface, as mounted on a tripod.

FIG. 21A is an exploded top perspective view of an image sensing 86 module, an integration plate tripod adapter 88, and a removable fixture 87 having a tripod interface 89, as mounted on a tripod 90. The integration plate tripod adapter 88 allows for electrical connection and wire routing to the tripod 90.

Figure 21B:
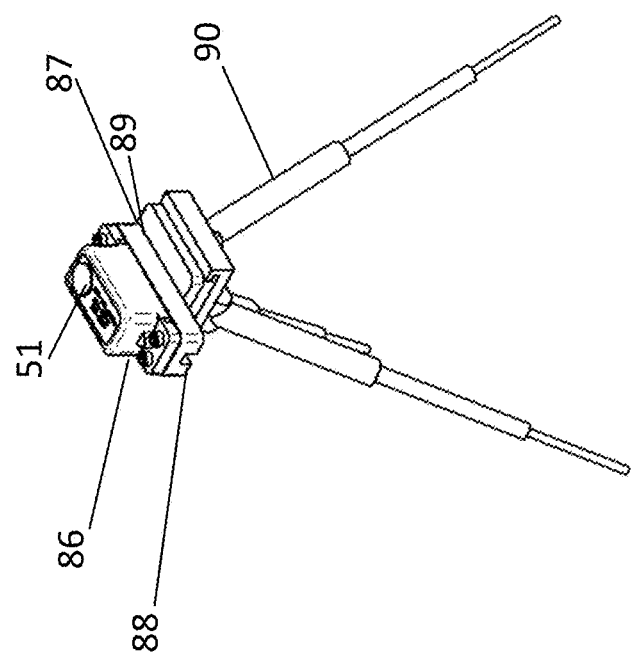
FIG. 21B is a top perspective view of an image sensing module, an integration plate tripod adapter, and a removable fixture having a tripod interface, as mounted on a tripod.

FIG. 21B is a top perspective view of an image sensing module 86, an integration plate tripod adapter 88, and a removable fixture 87 having a tripod interface 89, as mounted on a tripod 90.

While the foregoing specification has described specific embodiments of this invention and many details have been put forth for the purpose of illustration or example, it will be apparent to one skilled in the art that the invention is susceptible to additional embodiments and that certain of the details described herein can be varied considerably without departing from the basic principles of the invention.

What is claimed is:

1. An avionics system comprising:
   an integration plate having a mating surface;
   a structural network switch mountable on the integration plate by a switch mount feature such that a foundation face of the structural network switch engages the mating surface of the integration plate,
      wherein the structural network switch comprises a plurality of module connection features; and at least one module supported only by the integration plate or the structural network switch;
wherein each module connection feature comprises an electrical connector; and
wherein the structural network switch distributes power and data among the at least one module using the plurality of module connection features.

2. The system of claim 1 further comprising a plurality of avionics modules, wherein each of the plurality of avionics modules is connectible to the structural network switch at each of the module connection features.

3. The system of claim 1:
wherein the integration plate has a regular array of alignment holes;
wherein the structural network switch comprises at least one alignment recess; and
wherein each switch mount feature further comprises at least one alignment pin, wherein the at least one alignment pin passes through an alignment hole.

4. The system of claim 1 wherein each module connection feature comprises an environmental seal that provides an ingress-protection rating of at least IP60.

5. The system of claim 1 wherein the module connection feature provides a thermal connection between the module and the structural network switch, wherein the thermal connection has a thermal contact conductance coefficient greater than 500 W/(m²·K).

6. The system of claim 1 wherein each module connection feature comprises a first fastener and a second fastener.

7. The system of claim 1 further comprising a peripheral interface cable, wherein at least one of the plurality of avionics modules comprises a lateral peripheral interface to which the peripheral interface cable is connectible.

8. An avionics system comprising:
an integration plate having a mating surface;
a structural network switch,
wherein the structural network switch has a foundation face opposite a connection face,
wherein the structural network switch is mountable on the integration plate by a switch mount feature such that the foundation face of the structural network switch is proximate the mating surface of the integration plate; and
a plurality of avionics modules,
wherein each of the plurality of avionics modules is shaped approximately as a rectangular prism having a top face, a bottom face, a front face, a back face, a left face, a right face, a height, a width, and a depth,
wherein each of the plurality of avionics modules is connectible to the connection face of the structural network switch by a module connection feature, and
wherein a portion of the module connection feature is positioned on the bottom face of each the plurality of avionics modules;
wherein each module connection feature comprises an electrical connector; and
wherein the structural network switch distributes power and data among the plurality of avionics modules.

9. The system of claim 8, wherein at least one of the plurality of avionics modules comprises a lateral peripheral interface to which a peripheral interface cable is connectible,
wherein the lateral peripheral interface is positioned on a left face of the at least one of the plurality of avionics modules.

10. The system of claim 8, wherein the plurality of avionics modules are connectible to the structural network switch such that:
the bottom face of each of the plurality of avionics modules are proximate the connection face of the structural network switch;
the back face of a first avionics modules proximately neighbors with the front face of a second avionics module;
the top face, left face, and right face of the first avionics module do not proximately mate with any top face, bottom face, front face, back face, left face, or right face of the second avionics module.

11. The system of claim 8, further comprising a module structural relief device, wherein the module structural relief device is removably connected to the integration plate.

* * * * *